US009614501B2

(12) United States Patent
Maeda et al.

(10) Patent No.: US 9,614,501 B2
(45) Date of Patent: Apr. 4, 2017

(54) PULSE GENERATION CIRCUIT, SHIFT REGISTER CIRCUIT, AND DISPLAY DEVICE

(71) Applicant: Sharp Kabushiki Kaisha, Osaka-shi, Osaka (JP)

(72) Inventors: Kazuhiro Maeda, Osaka (JP); Yousuke Nakagawa, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 57 days.

(21) Appl. No.: 14/440,405

(22) PCT Filed: Oct. 21, 2013

(86) PCT No.: PCT/JP2013/078473
§ 371 (c)(1),
(2) Date: May 4, 2015

(87) PCT Pub. No.: WO2014/073362
PCT Pub. Date: May 15, 2014

(65) Prior Publication Data
US 2015/0295565 A1 Oct. 15, 2015

(30) Foreign Application Priority Data

Nov. 8, 2012 (JP) .................................. 2012-246070

(51) Int. Cl.
*H03K 3/011* (2006.01)
*H03K 3/356* (2006.01)
(Continued)

(52) U.S. Cl.
CPC ..... *H03K 3/356086* (2013.01); *G09G 3/3677* (2013.01); *G09G 5/006* (2013.01);
(Continued)

(58) Field of Classification Search
CPC .................................................... H03K 3/3565
See application file for complete search history.

(56) References Cited

U.S. PATENT DOCUMENTS 8,023,610 B2 * 9/2011 Miyayama ............. G11C 19/28
377/64
8,923,473 B2 * 12/2014 Sasaki .................. G09G 3/3677
377/64
(Continued)

FOREIGN PATENT DOCUMENTS

JP   2011-035688 A   2/2011
WO  2012/029871 A1  3/2012

OTHER PUBLICATIONS

Official Communication issued in International Patent Application No. PCT/JP2013/078473, mailed on Nov. 12, 2013.

*Primary Examiner* — Hai L Nguyen
(74) *Attorney, Agent, or Firm* — Keating & Bennett, LLP

(57) ABSTRACT

A pulse generation circuit is configured with a plurality of transistors of a single conductivity type. The pulse generation circuit includes: an output unit including a current limiting element configured to supply, by a predetermined current, a first voltage from a first power supply line supplied with the first voltage to an output terminal, the output unit being configured to perform a bootstrap operation that outputs the first voltage to the output terminal in response to a received input signal; and an output control unit configured to initiate the bootstrap operation when the output terminal transitions to the first voltage, and after the output terminal transitions to the first voltage, terminate the bootstrap operation and perform control so as to output the first voltage from the current limiting element to the output terminal.

9 Claims, 20 Drawing Sheets

(51) Int. Cl.
*G11C 19/28* (2006.01)
*G09G 3/36* (2006.01)
*G09G 5/00* (2006.01)
*G11C 19/18* (2006.01)

(52) U.S. Cl.
CPC .......... *G11C 19/184* (2013.01); *G11C 19/188* (2013.01); *G11C 19/28* (2013.01); *H03K 3/011* (2013.01); *G09G 2310/0286* (2013.01)

(56) References Cited

U.S. PATENT DOCUMENTS

2011/0025399 A1  2/2011  Tobita
2013/0169319 A1  7/2013  Sasaki et al.

* cited by examiner

PULSE GENERATION CIRCUIT, SHIFT REGISTER CIRCUIT, AND DISPLAY DEVICE

TECHNICAL FIELD

The present invention relates to a pulse generation circuit, a shift register circuit, and a display device.

Priority is claimed on Japanese Patent Application No. 2012-246070, filed Nov. 8, 2012, the content of which is incorporated herein by reference.

BACKGROUND ART

In recent years, there is a known technique in which driving circuits of display devices are configured with transistors of a single conductivity type and output signals at a power supply voltage level (see, for example, Patent Document 1).

In a technique described in Patent Document 1, an amplitude conversion circuit (pulse generation circuit) includes a resistor element connected between a first power supply terminal and an output terminal, an output transistor that gives an output to the output terminal, and a driving circuit that drives the output transistor in response to an input signal. The driving circuit shifts the level of an input signal by substantially the same level as that of a threshold voltage of the output transistor, and thereby supplies the shifted input signal to a control terminal of the output transistor.

CITATION LIST

Patent Document

[Patent Document 1] Japanese Patent Laid-Open Publication No. 2011-035688

DISCLOSURE OF THE INVENTION

Problems to be Solved by the Invention

By the way, in a case where the pulse generation circuit described in Patent Document 1 outputs an H-level (High (high) level, i.e., the voltage of a first power supply terminal in this case) to an output signal, the pulse generation circuit drives the output signal by the resistor element. For this reason, for example, in a case where a resistance value of the resistor element is large, a transition period of the output signal increases, and thus the pulse generation circuit described in Patent Document 1 cannot obtain the H-level at a predetermined timing at which an output signal is required, in some cases.

Additionally, in a case where the pulse generation circuit described in Patent Document 1 outputs an L-level (Low (low) level) to an output signal, the pulse generation circuit drives the output signal by the output transistor. In this case, since a current is supplied also from the resistor element, the L-level of the output signal is determined by a ratio of the resistance value of the resistor element and the on-resistance of the output transistor. For this reason, for example, in a case where a resistance value of the resistor element is reduced in order to shorten the transition period of the output signal, the L-level of the output signal increases, and thus the pulse generation circuit described in Patent Document 1 cannot obtain an amplitude sufficient to the output signal, in some cases.

Thus, in the pulse generation circuit described in Patent Document 1, there are cases where the output of the output terminal becomes unstable.

The present invention has been made to solve the above problems, and has an object to provide a pulse generation circuit, a shift register circuit, and a display device, which can reduce the instability of an output and achieve stable operation.

Means for Solving the Problems

In order to solve the above problems, a pulse generation circuit according to one embodiment of the present invention is configured with a plurality of transistors of a single conductivity type. The pulse generation circuit includes: an output unit including a current limiting element configured to supply, by a predetermined current, a first voltage from a first power supply line supplied with the first voltage to an output terminal, the output unit being configured to perform a bootstrap operation that outputs the first voltage to the output terminal in response to a received input signal; and an output control unit configured to initiate the bootstrap operation when the output terminal transitions to the first voltage, and after the output terminal transitions to the first voltage, terminate the bootstrap operation and perform control so as to output the first voltage from the current limiting element to the output terminal.

Additionally, in the pulse generation circuit according to another embodiment of the present invention, the current limiting element is connected between the first power supply line and the output terminal. The output unit may include: an output transistor configured to output the received input signal to the output terminal in response to a voltage of a control terminal; and a capacitive element connected between the output terminal and the control terminal of the output transistor. Additionally, the output control unit may be configured to control a voltage of the control terminal of the output transistor so that the output transistor is in a conductive state at least in a period from the time an output of the output terminal transitions from the first voltage to a predetermined voltage to the time the output of the output terminal transitions again to the first voltage. Further, the predetermined voltage may be a voltage between a second voltage supplied to a second power supply line and the first voltage.

Further, in the pulse generation circuit according to another embodiment of the present invention, the output control unit may include: a precharge unit configured to precharge the voltage of the control terminal of the output transistor to a voltage at which the output transistor enters the conductive state, at least in a period including the transition of the output of the output terminal from the first voltage to the predetermined voltage; and a reset unit configured to, in a case that the output of the output terminal transitions from the predetermined voltage to the first voltage, reset the voltage of the control terminal of the output transistor to a voltage at which the output transistor enters a non-conductive state.

Moreover, in the pulse generation circuit according to another embodiment of the present invention, the reset unit may include a reset transistor connected between the control terminal of the output transistor and a second power supply line supplied with a second voltage, the reset transistor comprising a control terminal connected to the output terminal.

Additionally, in the pulse generation circuit according to another embodiment of the present invention, the reset unit may include a first reset transistor and a second reset transistor connected in series between the control terminal of the output transistor and the second power supply line supplied with the second voltage. Further, the first reset transistor may include a control terminal connected to the output terminal. Moreover, the second reset transistor may include a control terminal connected to a signal line in a phase different from that of an input signal.

Further, in the pulse generation circuit according to another embodiment of the present invention, the plurality of transistors of the single conductivity type may include a plurality of N-channel transistors. Additionally, the first voltage may be higher than the second voltage.

Moreover, in the pulse generation circuit according to another embodiment of the present invention, the plurality of transistors of the single conductivity type may include a plurality of P-channel transistors. Additionally, the first voltage may be higher than the second voltage.

Additionally, a shift register circuit according to another embodiment of the present invention includes a plurality of unit circuits connected in multiple stages. The plurality of unit circuits may include the above-described pulse generation circuit.

Further, in the shift register circuit according to another embodiment of the present invention, the unit circuit may include: the pulse generation circuit in which a clock signal is input to the input signal; an output signal generation unit configured to output an output signal to the output terminal in response to the clock signal; and a shift signal generation unit configured to output a shift output signal in response to the output signal.

Moreover, in the shift register circuit according to another embodiment of the present invention, the shift signal generation unit may include: a first output transistor configured to, in response to a voltage of a control terminal, output, as the shift output signal, an inverted clock signal that is a clock signal in a phase opposite to that of the clock signal; a second output transistor connected between a second power supply line supplied with a second voltage different from the first voltage and a signal line of the shift output signal, the second output transistor comprising a control terminal connected to the output terminal; a capacitance element connected between the signal line of the shift output signal and the control terminal of the first output transistor; and a shift output control unit configured to control a voltage of the control terminal of the first output transistor, so that the first output transistor is in the conductive state at least in a period in which the shift output signal outputs the first voltage.

Additionally, a display device according to another aspect of the present invention may include a driving circuit including the above-described shift register circuit.

Effects of the Invention

According to the embodiments of the present invention, it is possible to reduce the instability of the output and achieve stable operation.

MODE FOR CARRYING OUT THE INVENTION

Figure 1:
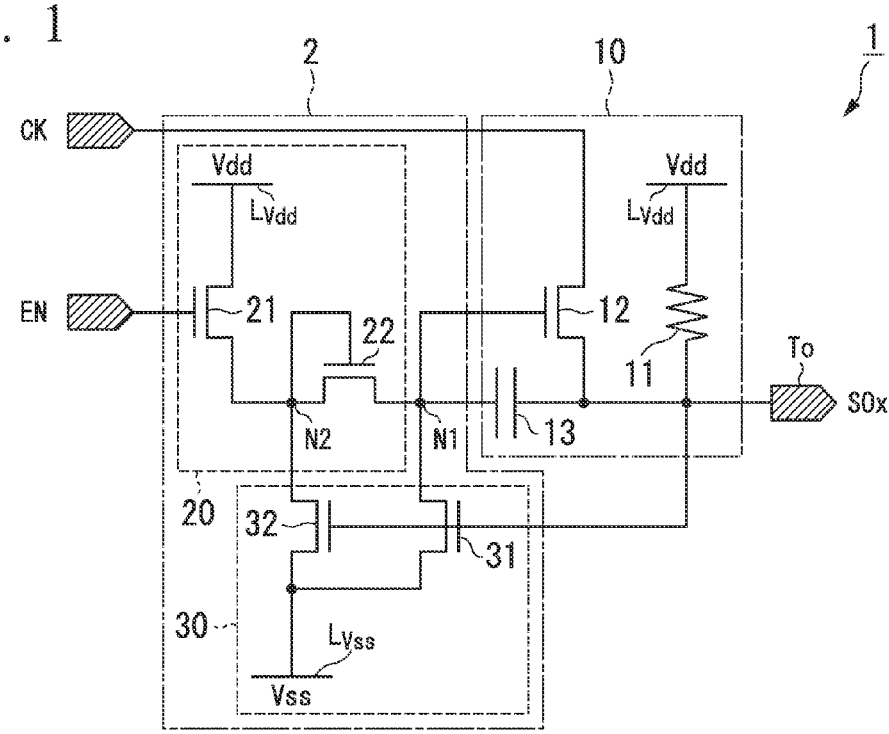
FIG. 1 is a block diagram showing an example of a pulse generation circuit according to a first embodiment.

Hereinafter, a pulse generation circuit according to one embodiment of the present invention, and a shift register circuit including the pulse generation circuit, and a display device, will be described with reference to the drawings.
[First Embodiment]
FIG. 1 is a block diagram showing an example of a pulse generation circuit 1 according to the first embodiment.
In the present embodiment, a plurality of transistors of the pulse generation circuit 1 are all configured with transistors of a single conductivity type. As an example, description will be given with respect to a case where the plurality of transistors of the pulse generation circuit 1 are configured with N-channel field-effect transistors (hereinafter, referred to as "N-type transistors") that are N-channel transistors. By configuring the pulse generation circuit 1 with transistors of a single conductivity type, it is possible to achieve simplification and a reduction in cost of the manufacturing process.

Here, in a field effect transistor, particularly in an insulated gate field effect transistor, electrical conductivity of a channel between drain and source regions in a semiconductor layer is controlled by an electric field in a gate insulating film. In an N-channel field effect transistor, carriers in a channel contributing to conduction are electrons. As a material of the semiconductor layer where the drain and source regions are formed, organic semiconductor such as polysilicon, amorphous silicon, or pentacene, oxide semiconductor such as single crystal silicon or IGZO (In—Ga—Zn-0), and the like, may be used.

In FIG. 1, the pulse generation circuit 1 includes an output unit 10 and an output control unit 2.

Additionally, in the present embodiment, the pulse generation circuit 1 has a power supply line $L_{Vdd}$ (first power supply line) supplied with a voltage Vdd (first voltage), and a power supply line $L_{Vss}$ (second power supply line) supplied with a voltage Vss (second voltage). The voltage Vdd is a voltage higher than the voltage Vss.

The output control unit 2 controls a voltage at a gate terminal of an N-type transistor 12 so that the N-type transistor 12 is in a conductive state at least in a period from the time an output of an output terminal To transitions from the voltage Vdd (H-level) to a predetermined voltage (L-level) different from the voltage Vdd to the time the out of the output terminal To transitions again to the voltage Vdd. Here, the predetermined voltage is a voltage between the voltage Vss and the voltage Vdd, which is determined based on a ratio of a resistance value of the resistor 11 and an on-resistance of the N-type transistor 12. The output control unit 2 is a circuit for controlling a gate voltage of the N-type transistor 12. In the present embodiment, the output control unit 2 feeds back an output signal to be output to the output terminal To, as a control signal for the output control unit 2.

Additionally, the output control unit 2 includes a precharge unit 20 and a reset unit 30.

The precharge unit 20 pre-charges the voltage at the gate terminal of the N-type transistor 12 to a voltage at which the N-type transistor 12 enters the conductive state, at least in a period including the transition of the output of the output terminal To from the voltage Vdd to the above-described predetermined voltage (voltage at the L-level). Here, the "pre-charge" means previously charging a predetermined node to a predetermined voltage. Additionally, in the pre-charge, the precharge unit 20 performs charging with respect to wiring capacitance of the node N1 and parasitic capacitance of the transistors connected to the node N1.

In a case where a control signal EN is at the H-level, the precharge unit 20 precharges (preliminarily charges) the node N1 to the voltage at which the N-type transistor 12 enters the conductive state. Additionally, in a case where the control signal EN is at the L-level, the precharge unit 20 terminates the precharging to the voltage at which the N-type transistor 12 enters the conductive state, and makes the node N1 in a floating state.

Further, the precharge unit 20 includes an N-type transistor 21 and an N-type transistor 22.

Regarding the N-type transistor 21 (first precharge transistor), a drain terminal is connected to the power supply line $L_{Vdd}$, a gate terminal is connected to a signal line of the control signal EN, and a source terminal is connected to the node N2. The N-type transistor 21 enters the conductive state in a case where the control signal EN is at the H-level (for example, the voltage level of the voltage Vdd), and supplies to the node N2, a voltage reduced from the voltage Vdd by a threshold voltage of the N-type transistor 21. Additionally, the N-type transistor 21 enters a non-conductive state when the control signal EN is at the L-level, and makes the node N2 in the floating state. Here, in this case, the N-type transistor 32 of the reset unit 30 is also in the non-conductive state.

Regarding the N-type transistor 22 (second precharge transistor), a drain terminal and a gate terminal are connected to the node N2, and a source terminal is connected to the node N1. In other words, the N-type transistor 22 is a diode-connected transistor serving as a diode, and is connected between the node N2 and the node N1. The N-type transistor 22 supplies to the node N1, a voltage reduced from the voltage supplied to the node N2 by a threshold voltage of the N-type transistor 22.

Thus, in the case where the control signal EN is at the H-level (for example, the voltage level of the voltage Vdd), the precharge unit 20 precharges the node N1 to a voltage obtained by "the voltage Vdd–(the threshold voltage of the N-type transistor 21)–(the threshold voltage of the N-type transistor 22)." Here, the voltage to be precharged to the node N1 is a voltage higher than the threshold voltage of the N-type transistor 12.

In a case where the output of the output terminal To transitions from a predetermined voltage to the voltage Vdd, the reset unit 30 resets (discharges) the voltage at the gate terminal (node N1) of the N-type transistor 12 to a voltage at which the N-type transistor 12 enters the non-conductive state. For example, based on the output signal of the output terminal To fed back as a control signal for the output control unit 2, the reset unit 30 performs control to have the gate voltage of the N-type transistor 12 transition to the voltage Vss so that the N-type transistor 12 enters the non-conductive state.

Additionally, the reset unit 30 includes an N-type transistor 31 and an N-type transistor 32.

Regarding the N-type transistor 31 (reset transistor), a drain terminal is connected to the node N1, a gate terminal is connected to the output terminal To, and a source terminal is connected to a power supply line $L_{Vss}$ of the voltage Vss. In a case where the output of the output terminal To is substantially at the voltage Vss, the N-type transistor 31 enters the non-conductive state, and makes the node N1 in the floating state. Additionally, in a case where the output of the output terminal To is at the voltage Vdd, the N-type transistor 31 enters the conductive state, and resets (discharges) the node N1 to the voltage Vss. Here, the driving capability (on-resistance) of the N-type transistor 31 is adjusted so as to have the node N1 transition to the voltage Vss after the output of the output terminal To reliably transitions to the voltage Vdd. Here, the driving capability (on-resistance) of the N-type transistor 31 is adjusted so that after the output of the output terminal To transitions to the voltage Vdd, the N-type transistor 31 resets (discharges) the node N1 to the voltage Vss over a predetermined period of time. Here, "discharge" means discharging a predetermined node to a predetermined voltage (for example, the voltage Vss), and thereby resetting the precharged state.

Regarding the N-type transistor 32, a drain terminal is connected to the node N2, a gate terminal is connected to the output terminal To, and a source terminal is connected to the power supply line $L_{Vss}$ of the voltage Vss. In a case where the output of the output terminal To is substantially at the voltage Vss, the N-type transistor 32 enters the non-conductive state, and makes the node N2 in a floating state. Additionally, in a case where the output of the output terminal To is at the voltage Vdd, the N-type transistor 32 enters the conductive state, and discharges (discharges), so as to reset, the node N2 to the voltage Vss.

The output unit 10 is a circuit having a bootstrap configuration, and includes a resistor 11, an N-type transistor 12, and a capacitor 13. The output unit 10 performs a bootstrap operation that is an operation for outputting the voltage Vdd to the output terminal To when the output of the output terminal To transitions from the L-level to the H-level.

Here, the L-level and the H-level represent logic levels of a signal. Here, the H-level represents a voltage level higher than the threshold voltage of the transistor, and includes a voltage level of the voltage Vdd. Additionally, the L-level represents a voltage level lower than the threshold voltage of the transistor, and includes a voltage level of the voltage Vss.

The resistor 11 (current limiting element) is connected between the power supply line $L_{Vdd}$ supplied with the voltage Vdd and the output terminal To, and supplies the voltage Vdd by a predetermined current from the power supply line $L_{Vdd}$ to the output terminal To.

Regarding the N-type transistor 12 (output transistor), a source terminal is connected to the signal line of the clock signal CK, a gate terminal (control terminal) is connected to the node N1, and a drain terminal is connected to the output terminal To. Here, the clock signal CK is an input signal that becomes an input for an output signal to be output from the output terminal To. In accordance with a voltage supplied from the output control unit 2 to the gate terminal, the N-type transistor 12 outputs the input clock signal CK to the output terminal To. The N-type transistor 12 enters the conductive state in a case where a voltage between the gate terminal and the source terminal is equal to or higher than the threshold voltage. Here, the "voltage between the gate terminal and the source terminal" represents that "a voltage at the gate terminal−a gate voltage at the source terminal," which will be hereinafter referred to as a "gate voltage." Additionally, the N-type transistor 12 enters the non-conductive state in a case where the gate voltage is equal to or lower than the threshold voltage.

The N-type transistor 12 outputs the voltage Vss to the drain terminal in a case where the voltage Vss is supplied to the clock signal CK in the conductive state. Additionally, in a case where the voltage Vdd is supplied to the clock signal CK in the conductive state where a voltage equal to or lower than the voltage Vdd is supplied to the gate terminal, the N-type transistor 12 outputs to the drain terminal, a voltage reduced from the voltage of the gate terminal by the threshold voltage. In other words, in order to output the voltage Vdd to the drain terminal of the N-type transistor 12, it is necessary to supply to the gate terminal, a voltage that is higher than the voltage Vdd by at least the threshold voltage (i.e., a voltage equal to or higher than "the voltage Vdd+the threshold voltage").

The capacitor 13 (capacitance element) is connected between the output terminal To and the gate terminal (node N1) of the N-type transistor 12. In order to supply to the gate terminal of the N-type transistor 12, the above-described voltage equal to or higher than "the voltage Vdd+the threshold voltage," the capacitor 13 charges the node N1 connected with the gate terminal of the N-type transistor 12, when the output of the output terminal To transitions from the L-level to the H-level.

Next, operation of the pulse generation circuit 1 according to the present embodiment will be described.

Figure 2:
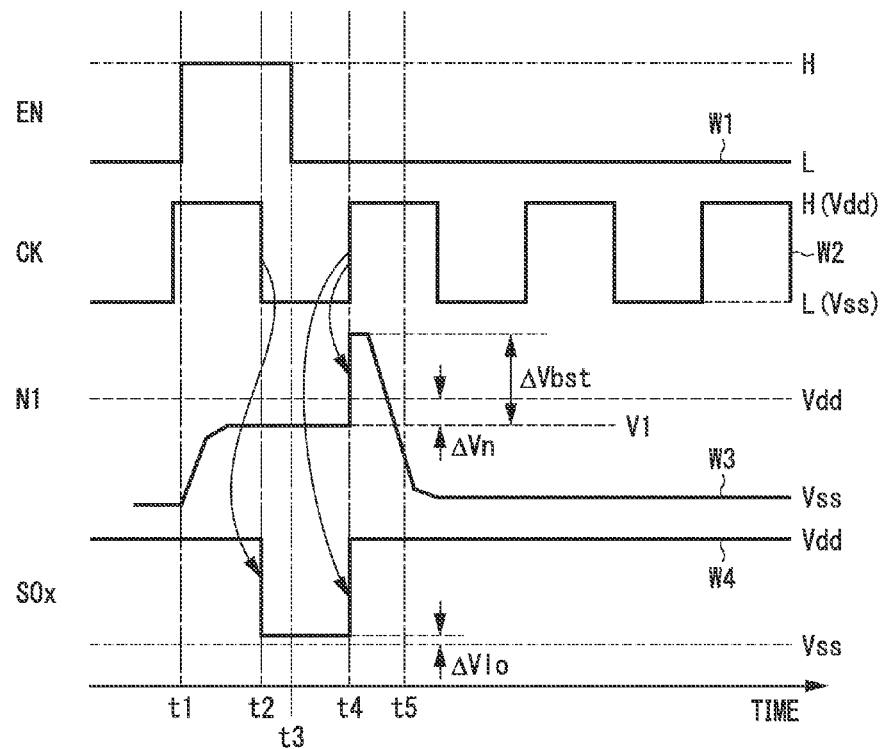
FIG. 2 is a time chart showing an example of operation of the pulse generation circuit according to the first embodiment.

FIG. 2 is a time chart showing an example of the operation of the pulse generation circuit 1 according to the present embodiment.

In FIG. 2, a waveform W1 represents a voltage waveform of the control signal EN. A waveform W2 represents a voltage waveform of the clock signal CK (input signal). Additionally, a waveform W3 represents a voltage waveform at the node N1 shown in FIG. 1. A waveform W4 represents a voltage waveform of the output signal SOx to be output to the output terminal To.

Additionally, in this figure, a horizontal axis represents time, and a vertical axis represents a signal level (voltage) of each waveform.

First, when the control signal EN transitions from the L-level to the H-level at time t1, the output control unit 2 of the pulse generation circuit 1 initiates precharge to the node N1. In other words, in this case, the N-type transistor 21 of the precharge unit 20 enters the conductive state, and the N-type transistor 21 supplies to the node N2, a voltage reduced from the voltage Vdd by the threshold voltage of the N-type transistor 21. Additionally, as a result, the diode-connected N-type transistor 22 enters the conductive state, and precharges the node N1 to a predetermined voltage V1. Here, the voltage V1 represents a voltage "V1=voltage Vdd−ΔVn," and the voltage ΔVn is a voltage determined by the threshold voltage of the N-type transistor 21 and the threshold voltage of the N-type transistor 22.

Additionally, at time t1, the clock signal CK is at the H-level. For this reason, when the node N1 becomes at a voltage equal to or higher than the threshold voltage of the N-type transistor 12, the pulse generation circuit 1 outputs the voltage Vdd (H-level) to the output terminal To.

Then, at time t2, the clock signal CK transitions from the H-level to the L-level, and the L-level of the clock signal CK is applied to the source terminal of the N-type transistor 12 of the output unit 10. The N-type transistor 12 enters the conductive state by the node N1 being precharged to the voltage equal to or higher than the threshold voltage of the N-type transistor 12. Then, the N-type transistor 12 supplies the voltage Vss (L-level) of the clock signal CK to the output terminal To. Here, the output terminal To is supplied with the voltage Vdd via the resistor 11. For this reason, the output signal SOx becomes at a voltage "Vss+ΔVlo" that is determined by a ratio of the on-resistance value of the N-type transistor 12 and the resistance value of the resistor 11. Thus, in the case where the clock signal CK transitions from the H-level to the L-level, the pulse generation circuit 1 has the output signal SOx transition from the voltage Vdd (H-level) to the voltage "Vss+ΔVlo" (L-level).

Here, the output signal SOx is at the signal level of the voltage Vdd in the period from time t1 to time t2. For this reason, the N-type transistor 31 and the N-type transistor 32 of the reset unit 30 enters the conductive state. Here, the driving capabilities of the N-type transistor 21 and the N-type transistor 22 of the precharge unit 20 are sufficiently higher than the driving capabilities of the N-type transistor 31 and the N-type transistor 32. For this reason, the node N1 and the node N2 are precharged to a voltage equal to or higher than the threshold voltage of the N-type transistor 12.

Next, when the control signal EN transitions from the H-level to the L-level at time t3, the output control unit 2 of the pulse generation circuit 1 terminates the precharge to the node N1. In this case, the output of the output terminal To is at the L-level voltage "Vss+ΔVlo." For this reason, the N-type transistor 31 and the N-type transistor 32 of the reset unit 30 are in the non-conductive state. Additionally, by the control signal EN transitioning to the L-level, the N type transistor 21 and the N-type transistor 22 of the precharge unit 20 enter the non-conductive state. For this reason, the node N1 enters the floating state while being precharged to the voltage equal to or higher than the threshold voltage of the N-type transistor 12.

Next, when the clock signal CK transitions from the L-level to the H-level at time t4, the output of the N-type transistor 12 of the output unit 10 changes to the H-level, in response to the clock signal CK. Then, by the output of the N-type transistor 12 changing to the H-level, the output unit 10 performs the bootstrap operation via the capacitor 13, and the node N1 becomes at a voltage higher than the precharged voltage by the voltage ΔVbst. Thus, the voltage higher than "the voltage Vdd+the threshold voltage" is supplied to the gate terminal. For this reason, the N-type transistor 12 outputs to the output terminal To, a voltage equal to the voltage Vdd. In other words, the N-type transistor 12 transfers, by the bootstrap operation, the H-level of the clock signal CK to the output signal SOx without voltage loss. Thus, in the case where the clock signal CK transitions from the L-level to the H-level, the pulse generation circuit 1 has the output signal SOx transition from the voltage "Vss+ ΔVlo" (L-level) to the voltage Vdd (H-level).

Additionally, here, the output of the output terminal To is at the H-level (voltage Vdd). Therefore, the N-type transistor 31 and the N-type transistor 32 enter the conductive state. For this reason, the N-type transistor 31 and the N-type transistor 32 discharge, so as to reset, the nodes N1 and N2 to the voltage Vss over a predetermined period of time. In other words, after the output of the output terminal To transitions to the voltage Vdd, the reset unit 30 resets (discharges) the node N1 to the voltage Vss over the predetermined period of time. Here, the predetermined period may be a period from time t4 to time t5.

Next, at time t5, the gate terminal of the N-type transistor 12, which is the node N1, becomes at a voltage lower than the threshold voltage of the N-type transistor 12, and thus the N-type transistor 12 enters the non-conductive state. Thus, the output unit 10 terminates the bootstrap operation. Then, the voltage Vdd is supplied by a predetermined current from the power supply line $L_{Vdd}$ to the output terminal To, thus maintaining the output signal SOx of the output terminal To at the voltage Vdd.

Thus, after time t4, the output signal SOx is maintained at the voltage Vdd.

As described above, the pulse generation circuit 1 according to the present embodiment is configured with transistors of a single conductivity type (for example, N-type transistors) and includes the output unit 10 and the output control unit 2. The output unit 10 includes the resistor 11 that supplies, by the predetermined current, the voltage Vdd from the power supply line $L_{Vdd}$ supplied with the voltage Vdd to the output terminal To, and performs the bootstrap operation that outputs the voltage Vdd to the output terminal To. Then, when the output of the output terminal To transitions to the voltage Vdd, the output control unit 2 initiates the bootstrap operation. After the output of the output terminal To transitions to the voltage Vdd, the output control unit 2 terminates the bootstrap operation, and performs control so as to output the voltage Vdd from the resistance 11 to the output terminal To.

Thus, for example, the bootstrap operation is performed in a case where the output signal SOx of the output terminal To changes, the pulse generation circuit 1 according to the present embodiment can expand the amplitude of the output signal SOx of the output terminal To. Further, after the output of the output terminal To transitions to the voltage Vdd, the voltage Vdd is supplied from the resistor 11 to the output terminal To. For this reason, the output signal SOx of the output terminal To is maintained at the signal level of the voltage Vdd.

Additionally, when the output signal SOx transitions to the voltage Vdd, the output signal SOx is driven by the bootstrap operation. Therefore, the pulse generation circuit 1 according to the present embodiment does not have to reduce the resistance value of the resistor 11, in order to shorten the transition time of the output signal SOx. For this reason, the pulse generation circuit 1 according to the present embodiment can expand the amplitude of the output signal SOx while maintaining the transition time of the output signal SOx.

Further, the pulse generation circuit 1 according to the present embodiment can not only expand the amplitude of the output signal SOx of the output terminal To, but also, for example, maintain the output terminal To at the signal level of the voltage Vdd even in a case where a leak occurs to a transistor or the like connected to the node in the floating state inside the output control unit 2.

Thus, the pulse generation circuit 1 according to the present embodiment can reduce the instability of the output, thereby achieving stable operation.

For example, in such a case where a low frequency pulse (for example, the output signal SOx (waveform W4)) is generated from a clock signal CK that is a high frequency signal, the pulse generation circuit 1 according to the present embodiment can stabilize the output of the low frequency pulse.

Additionally, in the present embodiment, the resistor 11 is connected between the power supply line $L_{Vdd}$ and the output terminal To. Further, the output unit 10 includes the N-type transistor 12 and the capacitor 13. The N-type transistor 12 outputs the input clock signal CK to the output terminal To in accordance with the voltage of the gate terminal. The capacitor 13 is connected between the output terminal To and the gate terminal of the N-type transistor 12. Additionally, the output control unit 2 controls the voltage of the gate terminal (node N1) of the N-channel transistor 12 so that the N-type transistor 12 is in the conductive state at least in the period from the time the output of the output terminal To transitions from the voltage Vdd to a predetermined voltage to the time the output of the output terminal To transitions again to the voltage Vdd. Here, the predetermined voltage is a voltage between the voltage Vss supplied to the power supply line $L_{Vss}$ and the voltage Vdd.

Thus, in a case where the signal level of the output terminal To is changed, the N-type transistor 12 primarily drives the signal of the output terminal To. After the output of the output terminal To transitions to the voltage Vdd, the resistance 11 maintains the output terminal To at the signal level of the voltage Vdd. For example, an attempt to shorten a transition period of the output signal while maintaining the amplitude of the output signal enabling stable operation can be fulfilled by increasing the driving capability of the N-type transistor 12. Additionally, in the configuration of the output unit 10 according to the present embodiment, it is not necessary to lower the resistance value of the resistor 11 in order to shorten the transition period of the output signal, thereby making it possible to suppress an increase in power consumption. Therefore, the pulse generation circuit 1 according to the present embodiment can achieve both stable operation and high speed without increasing the power consumption.

Additionally, according to the present embodiment, in the output control unit 2 the precharge unit 20 precharges the voltage at the gate terminal of the N-type transistor 12 to the voltage at which the N-type transistor 12 enters the conductive state, at least in a period including the transition of the output of the output terminal To from the voltage Vdd to a predetermined voltage (voltage "Vss+ΔVlo"). Then, when the output of the output terminal To transitions from the predetermined voltage (voltage "Vss+ΔVlo") to the voltage Vdd, the reset unit 30 resets the voltage at the gate terminal of the N-type transistor 12 to a voltage at which the N-type transistor 12 enters the non-conductive state.

Thus, the pulse generation circuit 1 according to the present embodiment with a simple configuration performs the bootstrap operation only in the transition period of the output signal SOx. After the output signal SOx transitions to the voltage Vdd, the output signal of SOx is maintained at the signal level of the voltage Vdd. Thus, the pulse generation circuit 1 according to the present embodiment can perform stable operation with a simple configuration.

Further, in the present embodiment, the reset unit 30 includes a reset transistor which is connected between the gate terminal of the N-type transistor 12 and the power supply line $L_{Vss}$ supplied with the voltage Vss, and which has a gate terminal connected to the output terminal To.

Thus, the pulse generation circuit 1 according to the present embodiment can, with a simple configuration, reliably terminate the bootstrap operation after the output signal SOx transitions to the voltage Vdd.

Next, a pulse generation circuit 1a according to a second embodiment will be described with reference to the drawings.

[Second Embodiment]

Figure 3:
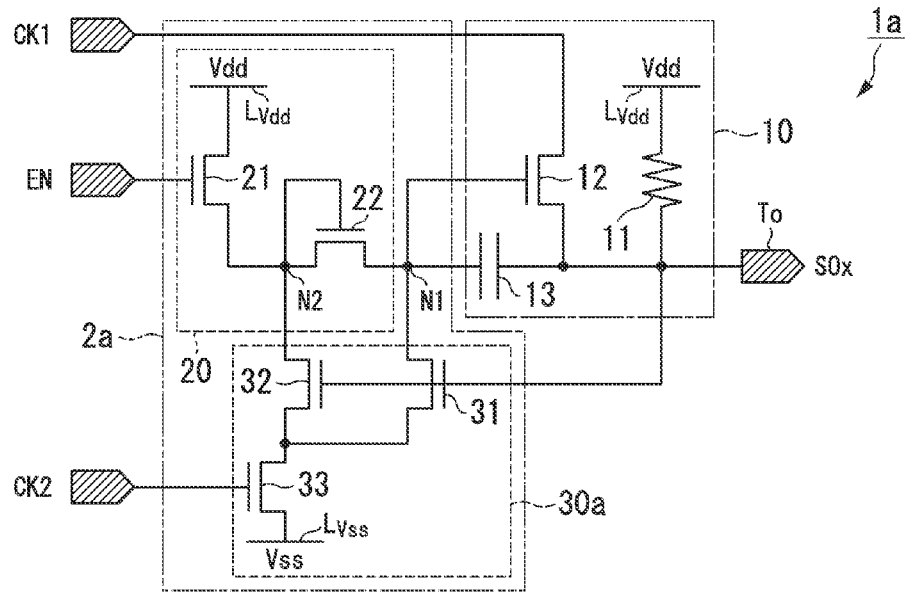
FIG. 3 is a block diagram showing an example of a pulse generation circuit according to a second embodiment.

FIG. 3 is a block diagram showing an example of the pulse generation circuit 1a according to the second embodiment.

In the present embodiment, the pulse generation circuit 1a differs from the first embodiment in that the reset unit 30 of the pulse generation circuit 1 according to the first embodiment is added with an N-type transistor 33 to be controlled by a clock signal CK2 that is a second input signal. Additionally, in the present embodiment, a clock signal CK1 that is a first input signal is input to the pulse generation circuit 1a, in place of the clock signal CK.

In FIG. 3, the pulse generation circuit 1a includes the output unit 10 and an output control unit 2a.

Here, in FIG. 3, the same reference numerals are appended to the same configurations as those shown in FIG. 1, and description thereof is omitted.

The output control unit 2a controls the voltage at the gate terminal of the N-type transistor 12 so that the N-type transistor 12 is in a conductive state at least in a period from the time an output of the output terminal To transitions from the voltage Vdd (H-level) to a predetermined voltage (L-level) different from the voltage Vdd to the time the output of the output terminal To transitions again to the voltage Vdd. The output control unit 2a is a circuit for controlling a gate voltage of the N-type transistor 12. In the present embodiment, the output control unit 2a feeds back an output signal to be output to the output terminal To, as a control signal for the output control unit 2a.

Additionally, the output control unit 2a includes a precharge unit 20 and a reset unit 30a.

Further, the reset unit 30a includes an N-type transistor 31, an N-type transistor 32, and an N-type transistor 33. Here, the precharge unit 20 includes an N-type transistor 21 and an N-type transistor 22, which are connected in series between the gate terminal of the N-type transistor 12 and the power supply line $L_{Vdd}$.

Regarding the N-type transistor 31 (first reset transistor), a drain terminal is connected to the node N1, a gate terminal is connected to the output terminal To, and a source terminal is connected to a Node N3. In a case where the output of the output terminal To is at the voltage Vss, the N-type transistor 31 enters the non-conductive state, and makes the node N1 in the floating state. Additionally, in a case where the output of the output terminal To is at the voltage Vdd, the N-type transistor 31 enters the conductive state.

Regarding the N-type transistor 32, a drain terminal is connected to the node N2, a gate terminal is connected to the output terminal To, and a source terminal is connected to the Node N3. In a case where the output of the output terminal To is at the voltage Vss, the N-type transistor 32 enters a non-conductive state, and makes the node N2 in a floating state. Additionally, in a case where the output of the output terminal To is at the voltage Vdd, the N-type transistor 32 enters a conductive state.

Regarding the N-type transistor 33 (second reset transistor), a drain terminal is connected to the Node N3, a gate terminal is connected to the clock signal CK2, and a source terminal is connected to the power supply line $L_{Vss}$ of the voltage Vss. The N-type transistor 33 enters a non-conductive-state in a case where the clock signal CK2 is at the L-level, and makes the Node N1 and the Node N2 in a floating state. Additionally, the N-type transistor 33 enters a conductive-state in a case where the clock signal CK2 is at the H-level, and resets (discharges) the nodes N1 and N2 to the voltage Vss. Here, the clock signal CK2 (second clock signal) is a signal that differs in phase from the clock signal CK1 (first clock signal).

Next, operation of the pulse generation circuit 1a according to the present embodiment will be described.

Figure 4:
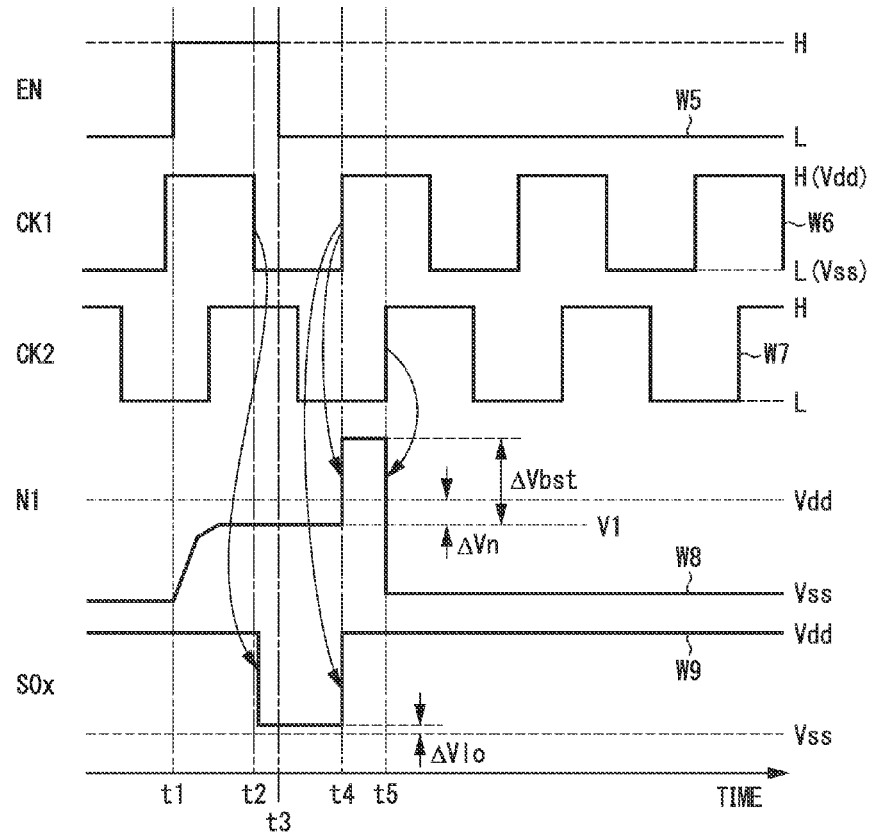
FIG. 4 is a time chart showing an example of operation of the pulse generation circuit according to the second embodiment.

FIG. 4 is a time chart showing an example of the operation of the pulse generation circuit 1a according to the present embodiment.

In FIG. 4, a waveform W5 represents a voltage waveform of the control signal EN. A waveform W6 represents a voltage waveform of the clock signal CK1 (first clock signal). A waveform W7 represents a voltage waveform of the clock signal CK2 (second clock signal). Additionally, a waveform W8 represents a voltage waveform at the node N1 shown in FIG. 3. A waveform W9 represents a voltage waveform of the output signal SOx to be output to the output terminal To according to the present embodiment. In this figure, a horizontal axis represents time, and a vertical axis represents a signal level (voltage) of each waveform.

In FIG. 4, operation from time t1 to time t4 is similar to the operation of the first embodiment shown in FIG. 2, except that the clock signal CK1 is used in place of the clock signal CK, and thus description thereof will be omitted here.

When the clock signal CK2 transitions from the L-level to the H-level at time t5, the pulse generation circuit 1a resets (discharges) the node N1 and the node N2 to the voltage Vss. Here, since the output of the output terminal To is at the H-level (voltage Vdd), the N-type transistor 31 and the N-type transistor 32 enter the conductive state. Then, by the clock signal CK2 changing from the L-level to the H-level, the N-type transistor 33 enters the conductive state. Thus, the N-type transistor 31, the N-type transistor 32, and the N-type transistor 33 reset (discharge) the node N1 and the node N2 to the voltage Vss.

By the reset process by the N-type transistor 31, the N-type transistor 32, and the N-type transistor 33, the gate terminal of the N-type transistor 12, which is the node N1, becomes at a voltage lower than the threshold voltage of the N-type transistor 12, and thus the N-type transistor 12 enters the non-conductive state. Thus, the output unit 10 terminates the bootstrap operation. Then, the voltage Vdd is supplied by a predetermined current from the power supply line $L_{Vdd}$ to the output terminal To, thus maintaining the output signal SOx of the output terminal To at the voltage Vdd.

Thus, after time t4, the output signal SOx is maintained at the voltage Vdd.

As described above, the pulse generation circuit 1a according to the present embodiment includes the output unit 10 and the output control unit 2a, and thus achieves the same effect as in the first embodiment.

Additionally, in the present embodiment, the reset unit 30a of the output control unit 2a includes the N-type transistor 31 and the N-type transistor 33, which are connected in series between the gate terminal of the N-type transistor 12 and the power supply line $L_{Vss}$ supplied with the voltage Vss. The gate terminal of the N-type transistor 31 is connected to the output terminal To. Additionally, the gate terminal of the N-type transistor 33 is connected to a signal line (signal line of the clock signal CK2) that differs in phase from the clock signal CK1.

Thus, for example, the period from time t4 to time t5 shown in FIG. 4 is defined by the clock signal CK1 and the clock signal CK2 as the output of the logic circuit. For this reason, the pulse generation circuit 1a according to the present embodiment enables more reliable transition of the output signal SOx (for example, a rise of the output signal SOx), compared to the first embodiment.

Further, in the present embodiment, as in the first embodiment, there is no need to adjust the driving capability (on-resistance) of the N-type transistor 31 to be sufficiently lowered so that the node N1 transitions to the voltage Vss after the output of the output terminal To reliably transitions to the voltage Vdd. In other words, in the first embodiment, in the case of lowering the driving capability of the N-type transistor 31, it is necessary to increase the gate length (L length) of the N-type transistor 31. In contrast, in the present embodiment, it is possible to control the timing at which the N-type transistor 33 resets the node N1. For this reason, there is no need to increase the gate length of the N-type transistor 31. In other words, in the pulse generation circuit 1a according to the present embodiment, the N-type transistor 31 and the N-type transistor 33 may be transistors in the minimum size. As a result, although the number of elements is increased as compared to the first embodiment, the pulse generation circuit 1a according to the present embodiment can achieve a reduction in area, as compared to the first embodiment.

Next, an example of a case where the above-described pulse generation circuit 1 according to the first embodiment is applied to a shift register of a display device will be described with reference to the drawings.

[Third Embodiment]

Figure 5:
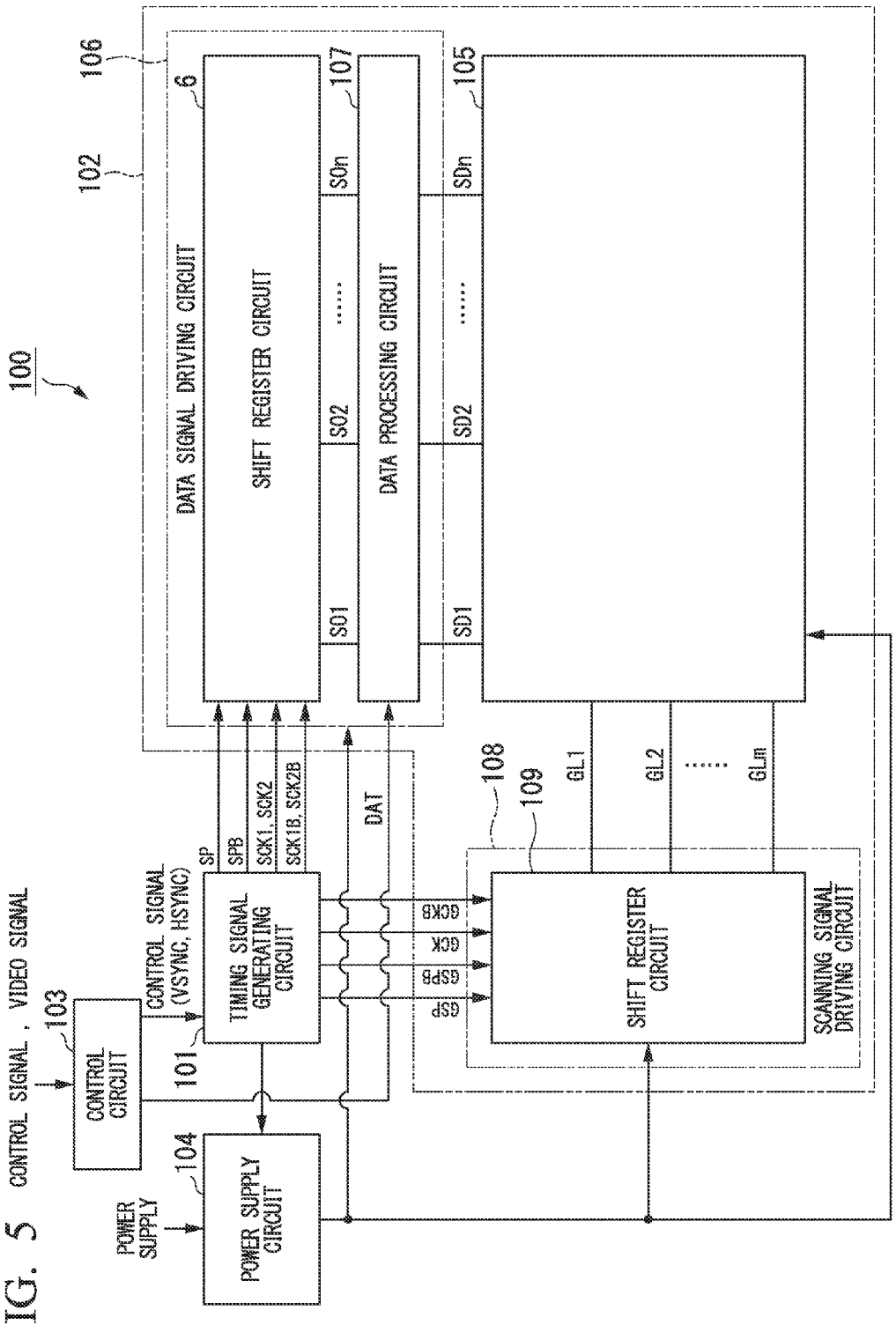
FIG. 5 is a block diagram showing an example of a display device according to a third embodiment.

FIG. 5 is a block diagram showing an example of a display device 100 according to the third embodiment.

In FIG. 5, the display device 100 includes a timing signal generation circuit 101, a display panel 102, a control circuit 103, and a power supply circuit 104. Additionally, the display panel 102 includes a display unit 105, a data signal driving circuit 106, and a scanning signal driving circuit 108.

The control circuit 103 generates a video signal DAT, and a signal VSYNC (vertical synchronization signal), a signal HSYNC (horizontal synchronization signal), and the like, based on a control signal and a video signal which are supplied from the outside. The control circuit 103 outputs to the timing signal generation circuit 101, a control signal including the generated signal VSYNC, the generated signal HSYNC, and the like. Additionally, the control circuit 103 outputs the video signal DAT to the data signal driving circuit 106.

The power supply circuit 104 supplies not only a power source to be output to later-described data signal lines SD1 to SDn, but also a power source for the scanning signal driving circuit 108, a common voltage source for the display unit 105, and the like.

The timing signal generation circuit 101 generates timing signals, such as source clock signals (SCK1, SCK1B, SCK2, and CK2B), source start pulses (SP, and SPB), gate clock signals (GCK, and GCKB), and gate start pulses (GSP, and GSPB). The timing signal generation circuit 101 outputs to the data signal driving circuit 106, the generated source clock signals (SCK1, SCK1B, SCK2, and SCK2B) and the generated source start pulses (SP, and SPB). Additionally, the timing signal generation circuit 101 outputs to the scanning signal driving circuit 108, the generated gate clock signals (GCK, and GCKB) and the generated gate start pulses (GSP, and GSPB). Further, the timing signal generation circuit 101 similarly generates a power control signal for controlling the power supply circuit 104, in synchronization with the signal VSYNC that is the vertical synchronization signal output from the control circuit 103. Then, the timing signal generation circuit 101 outputs the generated control signal to the power supply circuit 104.

The data signal driving circuit 106 includes a shift register circuit 6 and a data processing circuit 107, and is a driving circuit that generates a data signal. The data signal driving circuit 106 receives from the control circuit 103, the video signal DAT for each pixel which is transferred by time division. The data signal driving circuit 106 retrieves from the video signal DAT, video data for each pixel, at the timings based on the source clock signals (SCK1, SCK1B, SCK2, and SCK2B) and the source start pulses (SP, and SPB) which are output from the timing signal generation circuit 101 and serve as timing signals. Here, the source clock signal SCK2 is a signal that differs in phase from the source clock signal SCK1 (for example, a signal in the phase shifted by ¼ cycle). Additionally, the source clock signal SCK1B is an inverted signal of the source clock signal SCK1. The source clock signal SCK2B is an inverted signal of the source clock signal SCK2.

Specifically, for example, the shift register circuit 6 sequentially shifts the source start pulse (SP, or SPB) in synchronization with the on-timings of the source clock signals (SCK1, SCK1B, SCK2, and SCK2B), thus generating pulse signals with a cycle width (½ cycle width) that is half the cycle width of the source clock signal, as output signals SO1 to SOn with different timings. The data processing circuit 107 samples the video signal DAT at the timings indicated by the respective signals of the output signals SO1 to SOn generated by the shift register circuit 6. Then, the data processing circuit 107 outputs the sampled video signals DAT to the respective data signal lines SD1 to SDn. Here, as an analog voltage output to the data signal lines SD1 to SDn, a power supply voltage supplied from the power supply circuit 104 to the data signal driving circuit 106 is used.

The scanning signal driving circuit 108 includes a shift register circuit 109, and is a driving circuit that generates scanning signals. In the scanning signal driving circuit 108, the shift register circuit 109 sequentially shifts the gate start pulses (GSP, and GSPB) in synchronization with the gate clock signals (GCK, and GCKB) output from the timing signal generation circuit 101, thus outputting to scanning signal lines GL1 to GLm, scanning signals with the timings each shifted at a predetermined interval.

The display unit 105 has pixels of a liquid crystal display, which are arranged in a matrix (for example, n-digit×m-digit). A region of each pixel is formed by being partitioned by m scanning signal lines GL1 to GLm and n data signal lines SD1 to SDn, which are mutually intersecting with one another. The display unit 105 sequentially writes to the respective pixels, the video signals (data signals) DAT supplied from the control circuit 103 via the scanning signal lines GL1 to GLm and the data signal lines SD1 to SDn, thus displaying an image.

Next, a configuration of the shift register circuit 6 according to the present embodiment will be described.

Figure 6:
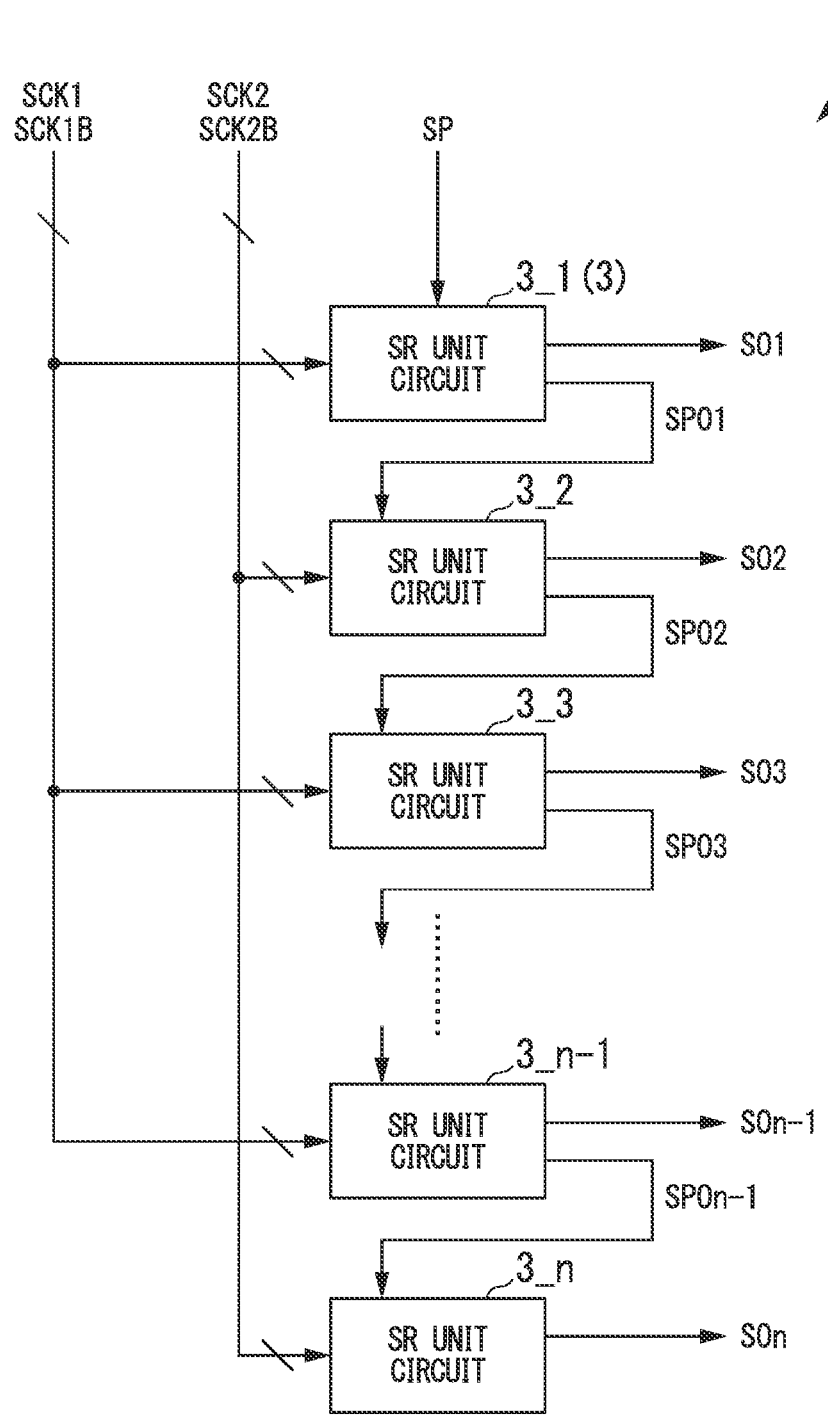
FIG. 6 is a block diagram showing an example of a shift register circuit according to the third embodiment.

FIG. 6 is a block diagram showing an example of the shift register circuit 6 according to the present embodiment.

In this figure, the shift register circuit 6 includes, for example, n SR unit circuits 3 (3_1 to 3_n), and is a shift register including the SR unit circuits 3 connected in multiple stages.

The SR unit circuit 3_1 in the first stage receives the source start pulse SP, and in response to the clock signal SCK1, outputs an output signal SO1 and a shift output signal SPO1 in the next stage.

The SR unit circuit 3_2 generates, based on the shift output signal SPO1, in response to the clock signal SCK2, an output signal SO2 and a shift output signal SPO2 in the next stage.

The SR unit circuit 3_3 generates, based on the shift output signal SPO2, in response to the clock signal SCK1B, an output signal SO3 and a shift output signal SPO3 in the next stage.

Similarly, the SR unit circuits 3 in the odd-numbered stages output, in response to the clock signal SCK1 (or SCK1B), an output signal SOx and a shift output signal SPOx in the next stage. Additionally, the SR unit circuits 3 in the even-numbered stages output, in response to the clock signal SCK2 (or SCK2B), an output signal SOx and a shift output signal SPOx in the next stage.

Thus, the SR unit circuits 3_1 to 3_n output the output signals SO1 to SOn synchronized with the rise or fall of the clock signal SCK1, or the rise or fall of the clock signal SCK2.

Next, a configuration of the SR unit circuit 3 according to the present embodiment will be described.

Figure 7:
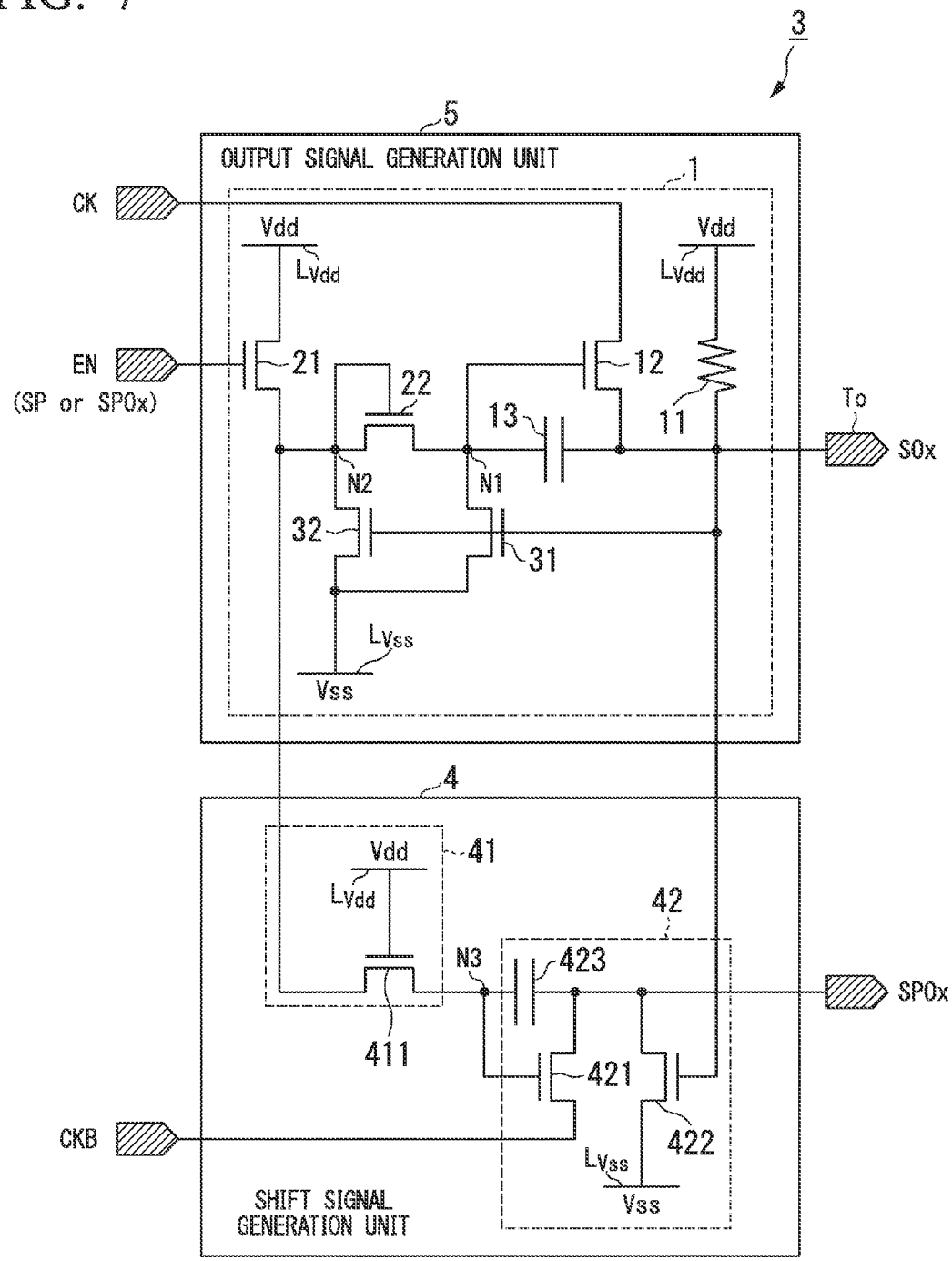
FIG. 7 is a block diagram showing an example of an SR unit circuit according to the third embodiment.

FIG. 7 is a block diagram showing an example of the SR unit circuit 3 according to the present embodiment.

In this figure, the SR unit circuit 3 includes an output signal generation unit 5 and a shift signal generation unit 4.

The output signal generation unit 5 includes a pulse generation circuit 1 according to the first embodiment. A clock signal SCK1 (SCK2, SCK1B, or SCK2B) is input to the clock signal CK. In response to clock signal SCK1 (SCK1B, SCK2, or SCK2B), the output signal generation unit 5 outputs an output signal SOx to the output terminal To. Here, the configuration of the pulse generation circuit 1 is similar to the configuration shown in FIG. 1, and description thereof is omitted here.

The shift signal generation unit 4 outputs a shift output signal SPOx in response to the output signal SOx. For example, the clock signal SCK1B (SCK2B, SCK1, or SCK2) is input to the clock signal CKB, and the output signal generation unit 5 outputs a shift output signal SPOx that is a logical inversion signal of the output signal SOx.

Additionally, the shift signal generation unit 4 includes a shift output control unit 41 and a shift output unit 42.

The shift output unit 42 performs a bootstrap operation based on the control signal output from the shift output control unit 41. Utilizing the bootstrap operation, the shift output unit 42 outputs a signal at a voltage level of the voltage Vdd, in response to the clock signal CKB. The shift output unit 42 includes, for example, an N-type transistor 421, an N-type transistor 422, and a capacitor 423.

In accordance with the voltage of the gate terminal, the N-type transistor 421 (first output transistor) outputs as a shift output signal SPOx, an inverted clock signal SCK1B (SCK2B, SCK1, or SCK2) that is a clock signal in the phase opposite to that of the clock signal SCK1 (SCK2, SCK1B, or SCK2B). Regarding the N-type transistor 421, for example, a source terminal is connected to a signal line of the clock signal CKB, a gate terminal (control terminal) is connected to the node N3, and a drain terminal is connected to a signal line of the shift output signal SPOx.

The N-type transistor 422 (second output transistor) is connected between the power supply line $L_{Vss}$ supplied with the voltage Vss and a signal line of the shift output signal SPOx, and a gate terminal thereof is connected to the output terminal To. In other words, regarding the N-type transistor 422, for example, a source terminal is connected to the power supply line $L_{Vss}$, the gate terminal is connected to the output terminal To, and a drain terminal is connected to the signal line of the shift output signal SPOx.

The capacitor 423 (capacitance element) is connected between the signal line of the shift output signal SPOx and the gate terminal (node N3) of the N-type transistor 421. In order to supply a voltage equal to or higher than "the voltage Vdd+the threshold voltage" to the gate terminal of the N-type transistor 421, the capacitor 423 charges the node N3 connected with the gate terminal of the N-type transistor 421, when the shift output signal SPOx transitions from the L-level to the H-level.

The shift output control unit 41 controls the voltage of the gate terminal of the N-type transistor 421, so that the N-type transistor 421 is in the conductive state at least in the period in which the shift output signal SPOx outputs the voltage Vdd.

Additionally, the shift output control unit 41 includes an N-type transistor 411.

Regarding the N-type transistor 411 (third precharge transistor), a drain terminal is connected to the node N2, a gate terminal is connected to the power supply line $L_{Vdd}$, and a source terminal is connected to the node N3. The N-type transistor 411 supplies (precharges) to the node N3, the voltage supplied to the node N2.

Here, after the voltage of the node N3 is precharged to a voltage higher than the threshold voltage at which the N-type transistor 421 enters the conductive state, when the shift output signal SPOx transitions from the voltage Vss to the voltage Vdd by the bootstrap operation, the voltage of the node N3 becomes a voltage higher than the voltage Vdd by at least the threshold voltage. Additionally, when the shift output signal SPOx transitions from the voltage Vdd to the voltage Vss by the bootstrap operation, the voltage of the node N3 returns to the precharge voltage. At the same time, the output terminal To transitions from the L-level to the H-level, and thereby the N-type transistor 32 enters the conductive state. Then, the node N2 becomes at the Vss level, and thereby the shift output signal SPOx eventually becomes at the voltage Vss.

Next, operation of the shift register circuit 6 according to the present embodiment will be described.

Figure 8:
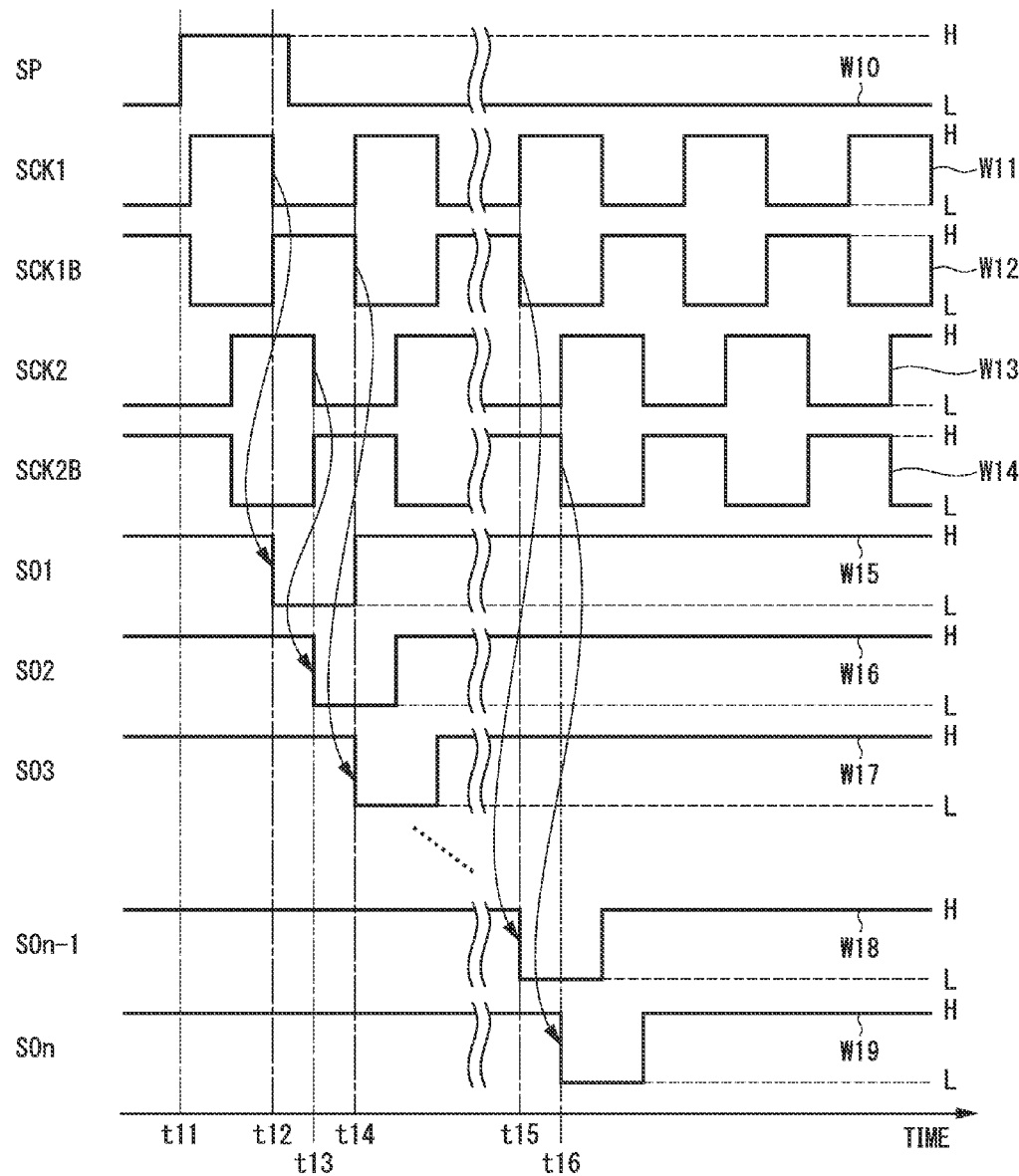
FIG. 8 is a time chart showing an example of operation of the shift register circuit according to the third embodiment.

FIG. 8 is a time chart showing an example of the operation of the shift register circuit 6 according to the present embodiment.

In FIG. 8, waveforms W10 to W14 respectively represent a voltage waveform of the source start pulse SP, a voltage waveform of the clock signal SCK1, a voltage waveform of the clock signal SCK1B, a voltage waveform of the clock signal SCK2, and a voltage waveform of the clock signal SCK2B. Additionally, waveforms W15 to W17 respectively represent voltage waveforms of the output signals SO1 to SO3. Waveforms W18 and W19 represent voltage waveforms of the output signal SOn−1 and SOn. Further, in this figure, a horizontal axis represents time, and a vertical axis represents a signal level (voltage) of each waveform.

First, when the source start pulse SP transitions from the L-level to the H-level at time t11, the shift register circuit 6 initiates shift operation.

Subsequently, in response to the fall of the first clock signal SCK1 after the rise of the source start pulse SP at time t12, the shift register circuit 6 outputs a pulse signal to the output signal SO1 (see the reference waveform W15).

Additionally, at time t13, in response to the fall of the first clock signal SCK2 after the fall of the output signal SO1, the shift register circuit 6 outputs a pulse signal to the output signal SO2 (see the reference waveform W16).

Further, at time t14, in response to the fall of the first clock signal SCK1B (the rise of the clock signal SCK1) after the fall of the output signal SO2, the shift register circuit 6 outputs a pulse signal to the output signal SO2 (see the reference waveform W17).

Thereafter, as shown in the waveforms W18 and W19, the shift register circuit 6 sequentially outputs a pulse signal to the output signal SOn−1 at time t15, and outputs a pulse signal to the output signal SOn at time t16.

Thus, the shift register circuit 6 initiates the shift operation from the rise of the source start pulse SP, sequentially outputs the output signals in the odd-numbered stages (SO1, SO3, . . . ) in response to the fall (or rise) of the clock signal SCK1, and sequentially outputs the output signals in the even-numbered stages (SO2, . . . ) in response to the fall (or rise) of the clock signal SCK2.

Next, operation of the SR unit circuit 3 of the shift register circuit 6 according to the present embodiment will be described.

Figure 9:
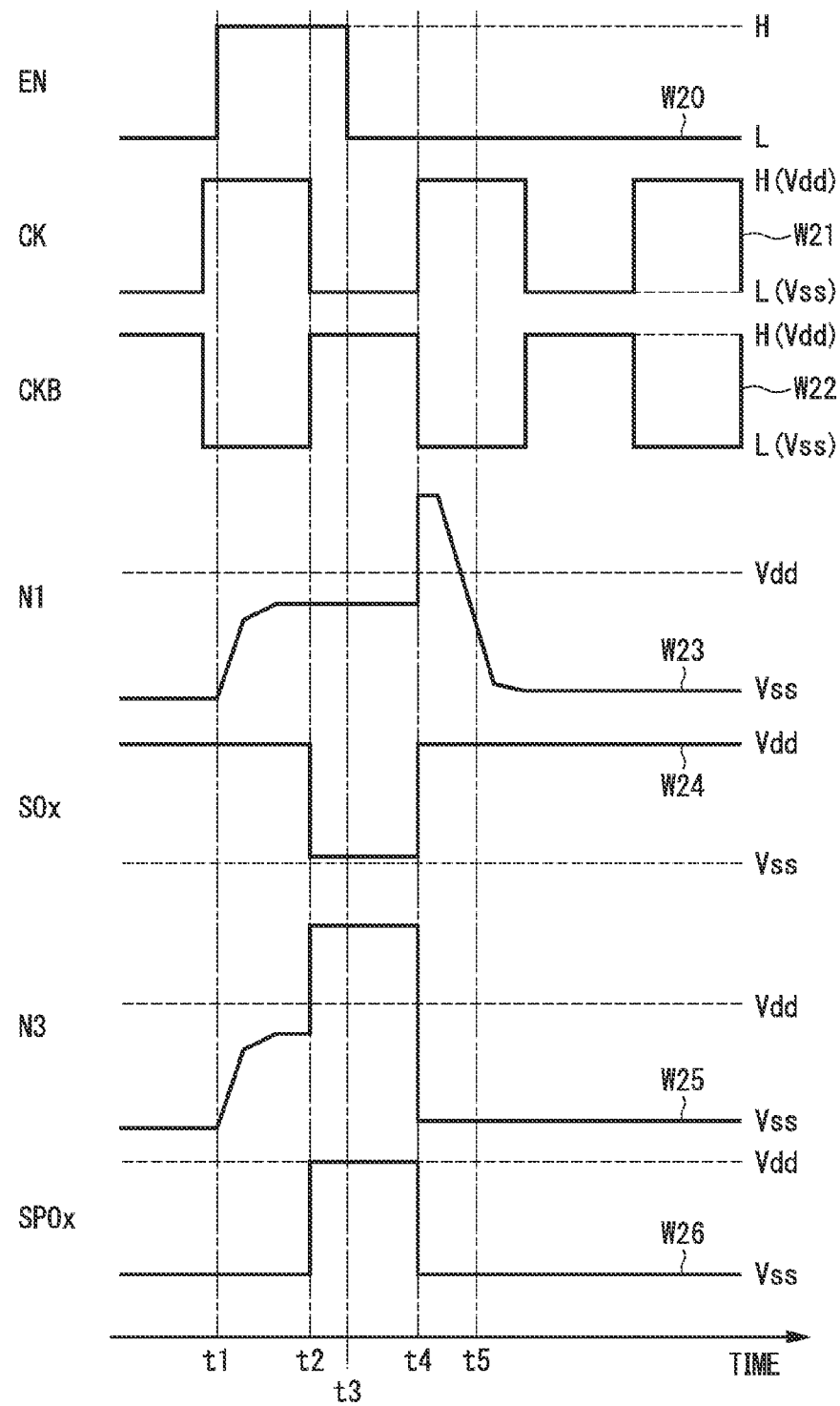
FIG. 9 is a time chart showing an example of operation of the SR unit circuit according to the third embodiment.

FIG. 9 is a time chart showing an example of the operation of the SR unit circuit 3 according to the present embodiment.

In FIG. 9, a waveform W20 represents a voltage waveform of the input signal EN (the source start pulse SP or the shift output signal SPOx in the previous stage). Additionally, a waveform W21 represents a voltage waveform of the clock signal CK (clock signal SCK1, SCK2, SCK1B, or SCK2B). A waveform W22 represents a voltage waveform of the clock signal CKB (clock signal SCK1B, SCK2B, SCK1, or SCK2). Further, a waveform W23 represents a voltage waveform at the node N1 shown in FIG. 7. A waveform W24 represents a voltage waveform of the output signal SOx to be output to the output terminal To. Moreover, a waveform W25 represents a voltage waveform at the node N3 shown in FIG. 7. A waveform W26 represents a voltage waveform of the shift output signal SPOx.

Additionally, in this figure, a horizontal axis represents time, and a vertical axis represents a signal level (voltage) of each waveform.

Here, in this figure, the waveform W20, the waveform W21, the waveform W23, and the waveform W24 show the operation of the output signal generation unit 5 of the SR unit circuit 3. The operation of the output signal generation unit 5 (operation from time t1 to time t5) are similar to the waveforms W1 to W4 shown in FIG. 2 of the first embodiment, and therefore description thereof is omitted here.

Here, operation of the shift signal generating unit 4 will be described.

When the control signal EN transitions from the L-level to the H-level at time t1, the shift output control unit 41 of the output signal generation unit 5 initiates precharge to the node N3. In other words, in this case, the N type transistor 21 of the precharge unit 20 enters the conductive state, and the N-type transistor 21 supplies to the node N2, a voltage reduced from the voltage Vdd by the threshold voltage of the N-type transistor 21, and the N-type transistor 411 precharges the node N3.

Here, at time t1, the clock signal CKB is at the L-level. For this reason, when the node N3 becomes at a voltage equal to or higher than the threshold voltage of the N-type transistor 421, the shift signal generation unit 4 outputs the voltage Vss (L-level) as the shift output signal SPOx.

Next, when the clock signal CKB transitions from the L-level to the H-level at time t2, the shift signal generation unit 4 has the shift output signal SPOx transition from the voltage Vss (L-level) to the voltage Vdd (H-level). In other words, the node N3 is precharged to a voltage equal to or higher than the threshold voltage of the N-type transistor 421, and thereby the N-type transistor 421 of the shift output unit 42 enters the conductive state. Then, the N-type transistor 421 outputs the voltage Vdd (H-level) of the clock signal CKB, as the shift output signal SPOx. Here, the node N3 is supplied with a voltage higher than the voltage Vdd via the capacitor 423. For this reason, the shift signal generation unit 4 outputs a voltage level of the voltage Vdd, as the shift output signal SPOx.

Next, when the control signal EN transitions from the H-level to the L-level at time t3, the shift output control unit 41 of the pulse generation circuit 1 terminates the precharge to the node N3. Here, the node N3 enters a floating state while remaining at a voltage higher than the voltage Vdd.

Next, when the clock signal CKB transitions from the H-level to the L-level at time t4, the shift signal generation unit 4 has the shift output signal SPOx transition from the voltage Vdd (H-level) to the voltage Vss (L-level). In this case, the output of the N-type transistor 421 of the shift output unit 42 changes to the L-level in response to the clock signal CKB. Thereby, the bootstrap operation is performed via the capacitor 423, and the N-type transistor 32 of the pulse generation circuit 1 enters the conductive state. For this reason, the node N3 becomes at a voltage lower than the threshold voltage. Thus, the N-type transistor 421 enters the non-conductive state. Additionally, at time t4, the output signal SOx of the output terminal To transitions to the H-level, and therefore the N type transistor 422 enters the conductive state. Thus, the N-type transistor 422 has the signal line of the shift output signal SPOx transition to the L-level.

As described above, the shift register circuit 6 according to the present embodiment is the shift register including the SR unit circuits 3 connected in multiple stages, and the SR unit circuit 3 includes the pulse generation circuit 1 according to the first embodiment.

For this reason, the shift register circuit 6 according to the present embodiment achieves a similar effect to that achieved by the pulse generation circuit 1 according to the first embodiment.

Additionally, in the present embodiment, the SR unit circuit 3 includes the output signal generation unit 5 and the shift signal generation unit 4. The output signal generation unit 5 includes the pulse generation circuit 1 where the clock signal SCK1 (or SCK2) is input to the clock signal CK. In response to the clock signal SCK1 (or SCK2), the output signal generation unit 5 outputs the output signal SOx to the output terminal To. The shift signal generation unit 4 outputs the shift output signal SPOx in response to the output signal SOx.

Thus, the shift register circuit 6 according to the present embodiment can implement, with a simple configuration, a shift register that sequentially outputs the output signals SO1 to SOn in response to the clock signal SCK1 (or SCK2).

Additionally, in the present embodiment, the shift signal generation unit 4 includes the shift output control unit 41 and the shift output unit 42. The shift output unit 42 includes the N-type transistor 421, the N-type transistor 422, and the capacitor 423. In accordance with the voltage of the gate terminal, the N-type transistor 421 outputs, as the shift output signal SPOx, an inverted clock signal SCK1B (or SCK2B) that is a clock signal in the phase opposite to that of the clock signal SCK1 (or SCK2). The N-type transistor 422 is connected between the power supply line $L_{Vss}$ supplied with the voltage Vss and the signal line of the shift output signal SPOx, and the gate terminal is connected to the output terminal To. The capacitor 423 is connected between the signal line of the shift output signal SPOx and the gate terminal (node N3) of the N-type transistor 421. Then, the shift output control unit 41 controls the voltage of the gate terminal of the N-type transistor 421, so that the N-type transistor 421 is in the conductive state at least in the period in which the shift output signal SPOx outputs the voltage Vdd.

Thus, the shift signal generation unit 4 constitutes a bootstrap circuit. For this reason, the shift register circuit 6 according to the present embodiment can expand the amplitude by the bootstrap operation, even for the outputs of the shift output signal SPO1 to SPOn, and maintain the shift output signals SPO1 to SPOn at the signal level of the voltage Vss. For this reason, the shift register circuit 6 according to the present embodiment can reduce the instability of the output, thereby achieving stable operation.

Additionally, according to the present embodiment, the display device 100 includes the driving circuit including the shift register circuit 6 (for example, the data signal driving circuit 106).

Thus, since the shift register circuit 6 includes the pulse generation circuit 1, the display device 100 of the present embodiment can reduce the instability of the output, thereby achieving stable operation. Additionally, the display device 100 of the present embodiment can achieve both stable operation and high speed, without increasing the power consumption. Further, the pulse generation circuit 1 and the shift register circuit 6 are configured with transistors of a single conductivity type. For this reason, since pixels and a driving circuit (or a part of the driving circuit) can be formed on the same substrate, the display device 100 of the present embodiment can reduce the manufacturing cost.

Next, as an alternative embodiment different from the third embodiment, an example of a case where the above-described pulse generation circuit 1a according to the second embodiment is applied to the shift register of the display device 100 will be described with reference to the drawings.

[Fourth Embodiment]

First, a configuration of a shift register circuit 6a according to the present embodiment will be described.

Figure 10:
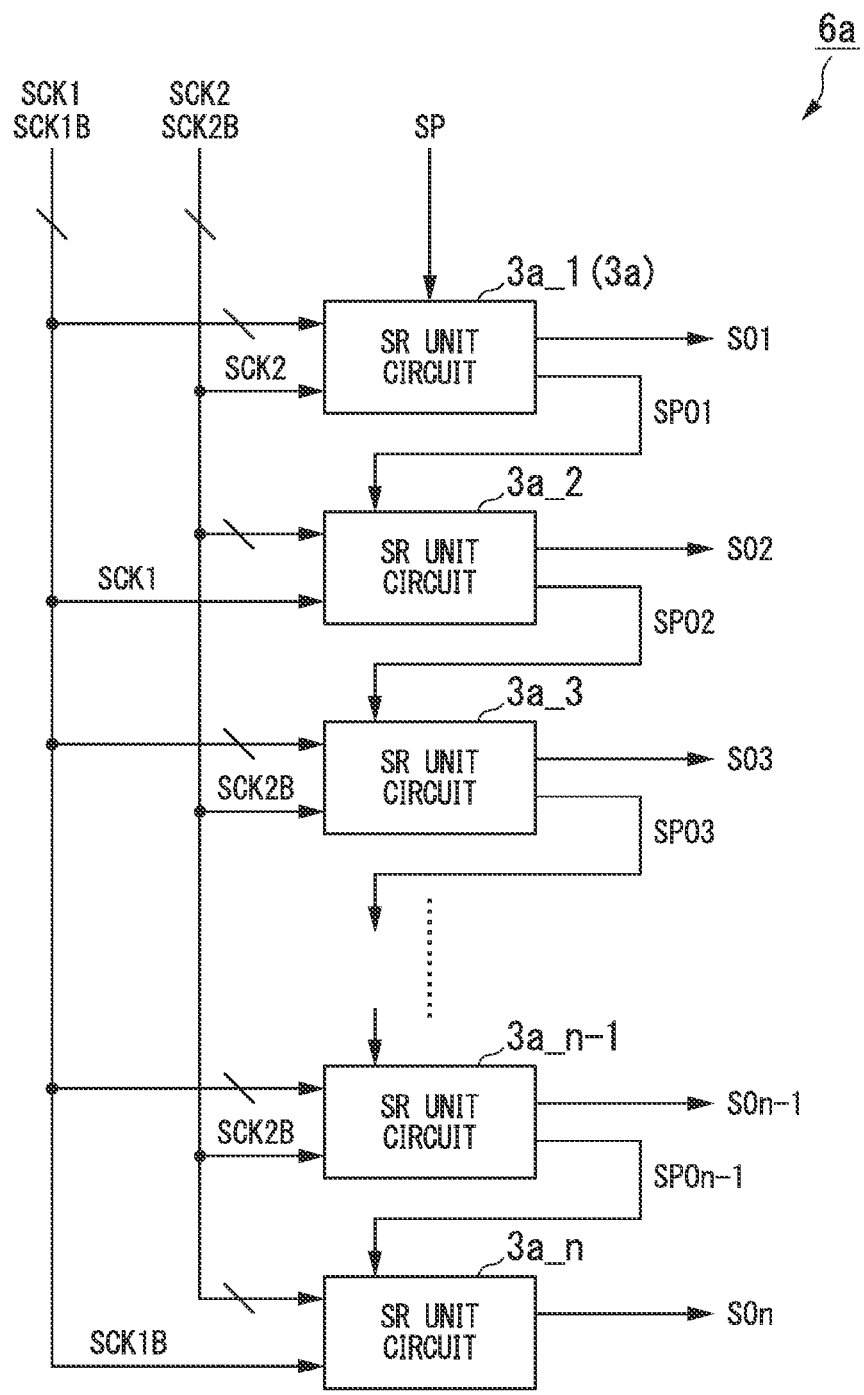
FIG. 10 is a block diagram showing an example of a shift register circuit according to a fourth embodiment.

FIG. 10 is a block diagram showing an example of the shift register circuit 6a according to the present embodiment.

In this figure, the shift register circuit 6a includes, for example, n SR unit circuits 3a (3a_1 to 3a_n), and is a shift register including the SR unit circuits 3a connected in multiple stages.

Here, the display device 100 according to the present embodiment is similar to the display device 100 shown in FIG. 5, except that the shift register circuit 6a is included in place of the shift register circuit 6.

The shift register circuit 6a according to the present embodiment includes n SR unit circuits 3a (3a_1 to 3a_n), in place of the n SR unit circuits 3 (3_1 to 3_n) according to the third embodiment. Here, the n SR unit circuits 3a receive any one of a plurality of groups of signals which are (clock signals SCK1, SCK1B, and SCK2), (SCK2, SCK2B, and SCK1), (clock signals SCK1B, SCK1, and SCK2B), and (SCK2B, SCK2, and SCK1B).

The SR unit circuit 3a_1 in the first stage receives the source start pulse SP, and in response to the clock signal SCK1, outputs an output signal SO1 and a shift output signal SPO1 in the next stage.

The SR unit circuit 3a_2 generates, based on the shift output signal SPO1, in response to the clock signal SCK2, an output signal SO2 and a shift output signal SPO2 in the next stage.

The SR unit circuit 3a_3 generates, based on the shift output signal SPO2, in response to the clock signal SCK1B, an output signal SO3 and a shift output signal SPO3 in the next stage.

Similarly, the SR unit circuits 3a in the odd-numbered stages output, in response to the clock signal SCK1 (or SCK1B), an output signal SOx and a shift output signal SPOx in the next stage. Additionally, the SR unit circuits 3a in the even-numbered stages output, in response to the clock signal SCK2 (or SCK2B), an output signal SOx and a shift output signal SPOx in the next stage.

Thus, the SR unit circuits 3a_1 to 3a_n output the output signals SO1 to SOn synchronized with the rise or fall of the clock signal SCK1, or the rise or fall of the clock signal SCK2.

Next, a configuration of the SR unit circuit 3a according to the present embodiment will be described.

Figure 11:
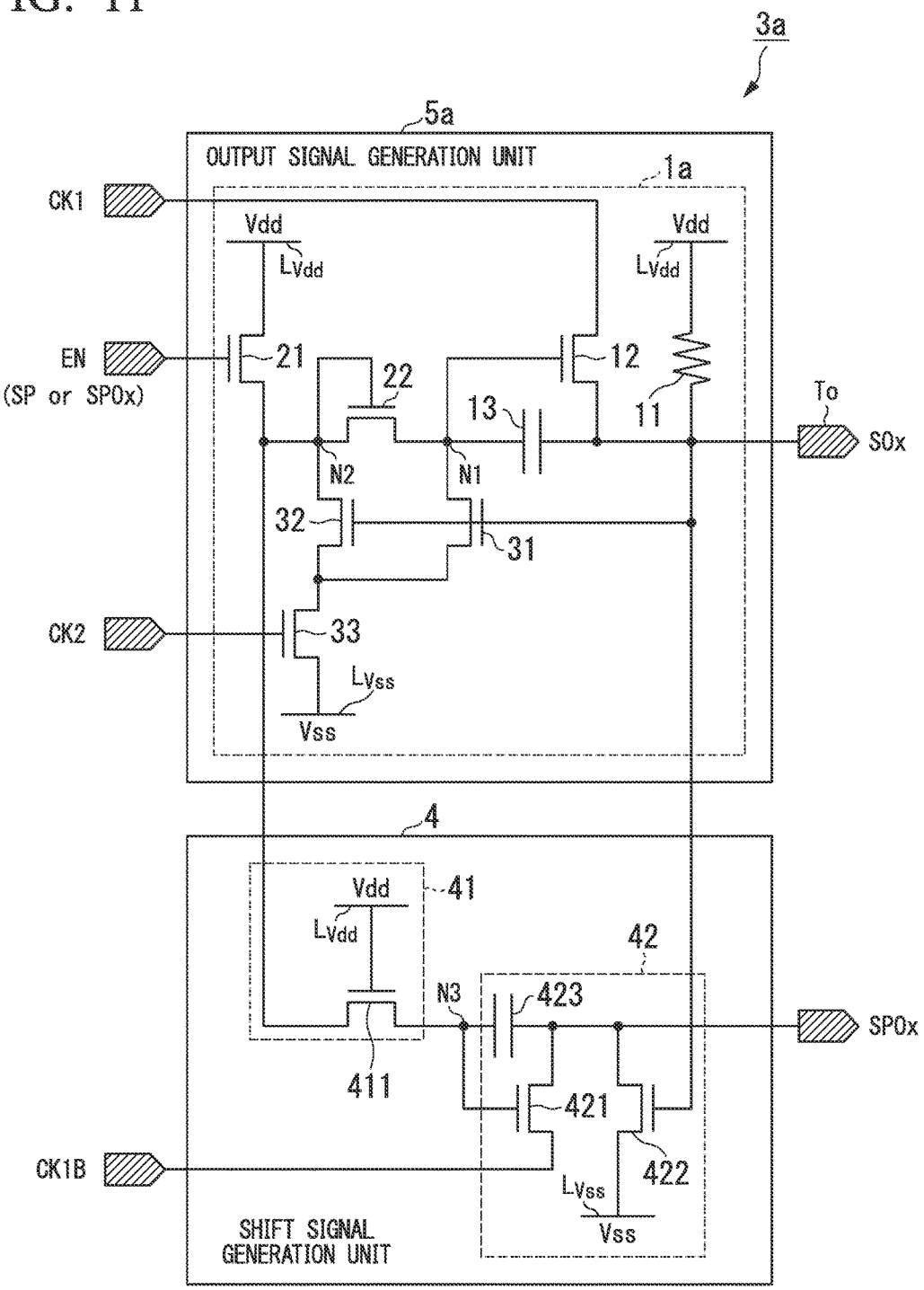
FIG. 11 is a block diagram showing an example of an SR unit circuit according to the fourth embodiment.

FIG. 11 is a block diagram showing an example of the SR unit circuit 3a according to the present embodiment.

In this figure, the SR unit circuit 3a includes an output signal generation unit 5a and the shift signal generation unit 4.

The output signal generation unit 5a includes the pulse generation circuit 1a according to the second embodiment. A clock signal SCK1 (SCK2, SCK1B, or SCK2B) is input to the clock signal CK1. In response to a clock signal SCK1 (SCK2, SCK1B, or SCK2B), the output signal generation unit 5a outputs an output signal SOx to the output terminal To. Here, the configuration of the pulse generation circuit 1a is similar to the configuration shown in FIG. 3, and description thereof is omitted here.

Additionally, in FIG. 11, the same reference numerals are appended to the same configurations as those shown in FIG. 7, and description thereof is omitted here.

Next, operation of the shift register circuit 6a according to the present embodiment will be described.

The operation of the shift register circuit 6a according to the present embodiment is similar to the operation of the shift register circuit 6 shown in FIG. 8, and therefore description thereof will be omitted here.

Next, operation of the SR unit circuit 3a of the shift register circuit 6a according to the present embodiment will be described.

Figure 12:
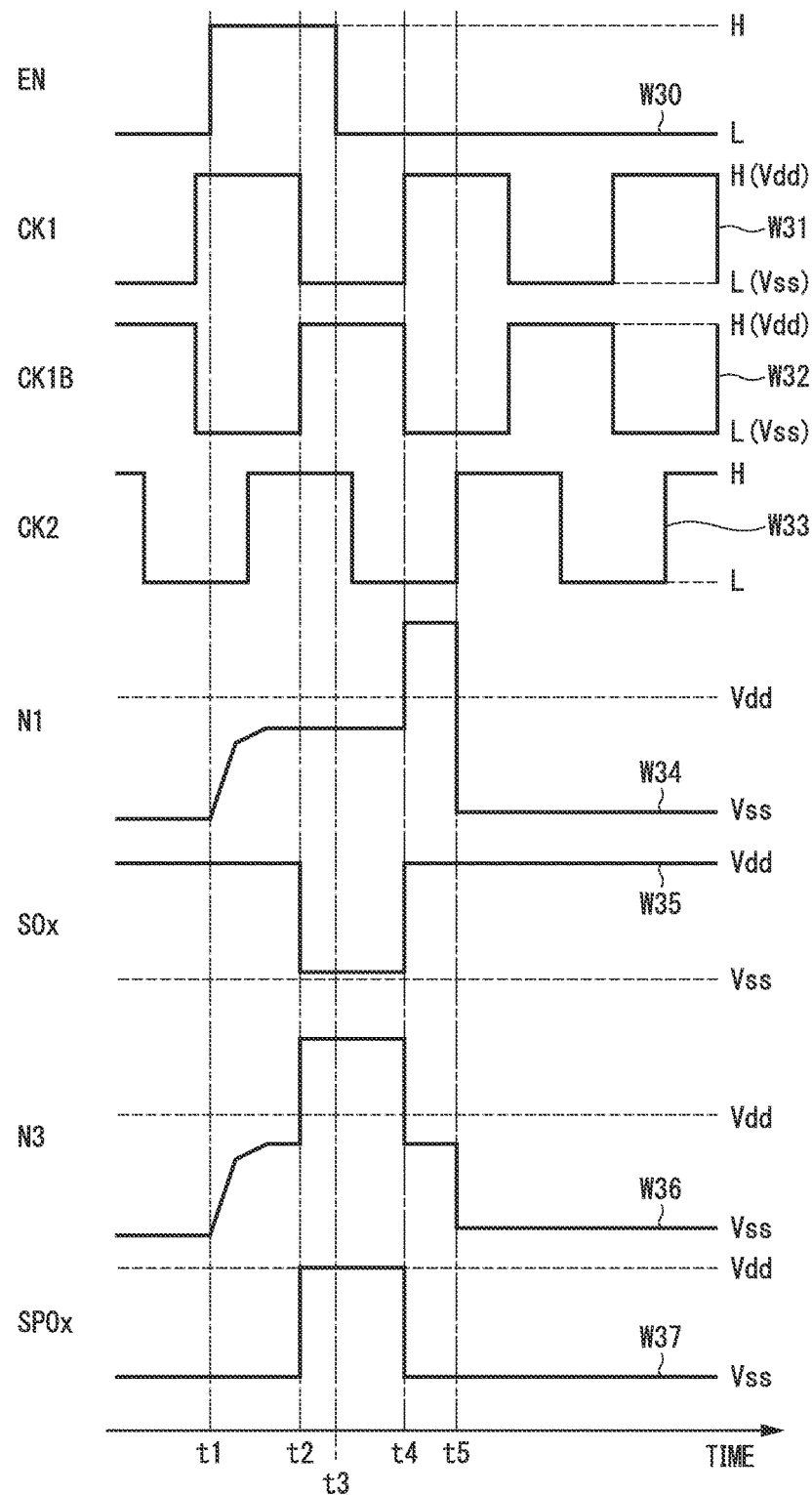
FIG. 12 is a time chart showing an example of operation of the SR unit circuit according to the fourth embodiment.

FIG. 12 is a time chart showing an example of the operation of the SR unit circuit 3a according to the present embodiment.

In FIG. 12, a waveform W30 represents a voltage waveform of the input signal EN (the source start pulse SP or the shift output signal SPOx in the previous stage). Additionally, a waveform W31 represents a voltage waveform of the clock signal CK1 (clock signal SCK1, SCK2, SCK1B, or SCK2B). Further, a waveform W32 represents a voltage waveform of the clock signal CK1B (clock signal SCK1B, SCK2B, SCK1, or SCK2). Additionally, a waveform W33 represents a voltage waveform of the clock signal CK2 (clock signal SCK2, SCK1, SCK2B, or SCK1B). Further, a waveform W34 represents a voltage waveform at the node N1 shown in FIG. 11. Additionally, a waveform W35 represents a voltage waveform of the output signal SOx to be output to the output terminal To. Moreover, a waveform W36 represents a voltage waveform at the node N3 shown in FIG. 11. Additionally, a waveform W37 represents a voltage waveform of the output signal SOx.

Additionally, in this figure, a horizontal axis represents time, and a vertical axis represents a signal level (voltage) of each waveform.

Here, in this figure, the waveform W30, the waveform W31, and the waveforms W33 to W35 show the operation of the output signal generation unit 5a of the SR unit circuit 3a. The operation of the output signal generation unit 5a (operation from time t1 to time t5) is similar to the waveforms W5 to W9 shown in FIG. 4 of the second embodiment, and therefore description thereof is omitted here.

Additionally, the waveform W32, the waveform W36, and the waveform W37 show operation of the shift signal generation unit 4 of the SR unit circuit 3a. The operation of the shift signal generation unit 4 from time t1 to time t3 is similar to the waveform W22, the waveform W25, and the waveform W26, which are shown in FIG. 9 of the third embodiment.

Next, when the clock signal CK1B transitions from the H-level to the L-level at time t4, the shift signal generation unit 4 has the shift output signal SPOx transition from voltage Vdd (H-level) to the voltage Vss (L-level). In this case, the output of the N-type transistor 421 of the shift output unit 42 changes to the L-level in response to the clock signal CK1B. Thus, the bootstrap operation is performed via the capacitor 423, and the node N3 becomes at a voltage lower than the voltage Vdd. Additionally, at time t4, the output signal SOx of the output terminal To transitions to the H-level, and thereby the N type transistor 422 enters the conductive state. Thus, the N-type transistor 422 has the signal line of the shift output signal SPOx transition to the L-level.

Next, when the clock signal CK2 transitions from the L-level to the H-level at time t5, the N-type transistor 33 of the pulse generation circuit 1a enters the conductive state, and thereby the node N3 becomes at a voltage lower than the threshold voltage. Thus, the N-type transistor 421 enters the non-conductive state.

As described above, the shift register circuit 6a according to the present embodiment is the shift register including the SR unit circuits 3a connected in multiple stages, and the SR unit circuit 3a includes the pulse generation circuit 1a of the second embodiment.

For this reason, the shift register circuit 6a according to the present embodiment achieves a similar effect to that achieved by the pulse generation circuit 1a according to the second embodiment.

In the above-described first to fourth embodiments, as an example where the pulse generation circuit 1 (1a) is configured with transistors of a single conductivity type, the embodiments where the pulse generation circuit 1 (1a) is configured with the N-type transistors, have been described. However, the pulse generation circuit 1 (1a) may be configured with P-channel field effect transistors (hereinafter referred to as "P type transistors").

Hereinafter, description will be given with respect to an embodiment in a case where P-type transistors are used as transistors of a single conductivity type.

[Fifth Embodiment]

Figure 13:
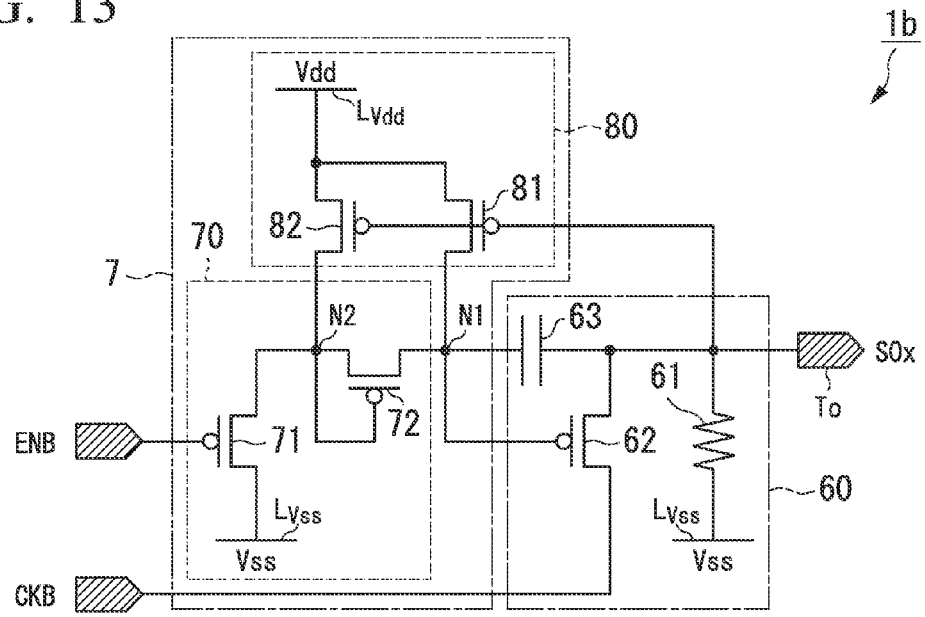
FIG. 13 is a block diagram showing an example of a pulse generation circuit according to a fifth embodiment.

FIG. 13 is a block diagram showing an example of a pulse generation circuit 1b according to the fifth embodiment.

FIG. 13 shows an example of the pulse generation circuit 1b according to the present embodiment, which is obtained by replacing the N-type transistors of the pulse generation circuit 1 according to the first embodiment with P-type transistors.

In FIG. 13, the pulse generation circuit 1b includes an output unit 60 and an output control unit 7.

Additionally, in the present embodiment, the pulse generation circuit 1b includes the power supply line $L_{Vss}$ (first power supply line) supplied with the voltage Vss (first voltage), and the power supply line $L_{Vdd}$ (second power supply line) supplied with the voltage Vdd (second voltage). Here, the voltage Vdd is a voltage higher than the voltage Vss.

The output control unit 7 controls a voltage at a gate terminal of a P-type transistor 62 so that the P-type transistor 62 is in a conductive state at least in a period from the time an output of an output terminal To transitions from the voltage Vss (L-level) to a predetermined voltage (H-level) different from the voltage Vss to the time the out of the output terminal To transitions again to the voltage Vss. Here, the predetermined voltage is a voltage between the voltage Vdd and the voltage Vss, which is determined based on a ratio of a resistance value of the resistor 61 and an on-resistance of the P-type transistor 62. The output control unit 7 is a circuit for controlling a gate voltage of the P-type transistor 62. In the present embodiment, the output control unit 7 feeds back an output signal to be output to the output terminal To, as a control signal for the output control unit 7.

Additionally, the output control unit 7 includes a precharge unit 70 and a reset unit 80.

The precharge unit 70 pre-charges the voltage at the gate terminal of the P-type transistor 62 to a voltage at which the P-type transistor 62 enters the conductive state, at least in a period including the transition of the output of the output terminal To from the voltage Vss to the above-described predetermined voltage (voltage at the H-level). In a case where a control signal ENB is at the L-level, the precharge unit 70 precharges (preliminarily charges) the node N1 to the voltage at which the P-type transistor 62 enters the conductive state. Additionally, in a case where the control signal ENB is at the H-level, the precharge unit 70 terminates the precharging to the voltage at which the P-type transistor 62 enters the conductive state, and makes the node N1 in a floating state.

Further, the precharge unit 70 includes a P-type transistor 71 and a P-type transistor 72.

Regarding the P-type transistor 71 (first precharge transistor), a drain terminal is connected to the power supply line $L_{Vss}$, a gate terminal is connected to a signal line of the control signal ENB, and a source terminal is connected to the node N2. The P-type transistor 71 enters in the conductive state in a case where the control signal ENB is at the L-level (for example, the voltage level of the voltage Vss), and supplies to the node N2, a voltage increased from the voltage Vss by a threshold voltage of the P-type transistor 71. Additionally, the P-type transistor 71 enters a non-conductive state in a case where the control signal ENB is at the H-level, and makes the node N2 in the floating state. Here, in this case, the P-type transistor 82 of the reset unit 80 is also in the non-conductive state.

Regarding the P-type transistor 72 (second precharge transistor), a drain terminal and a gate terminal are connected to the node N2, and a source terminal is connected to the node N1. In other words, the P-type transistor 72 is a diode-connected transistor serving as a diode, and is connected between the node N2 and the node N1. The P-type transistor 72 supplies to the node N1, a voltage increased from the voltage supplied to the node N2 by a threshold voltage of the P-type transistor 22.

Thus, in the case where the control signal ENB is at the L-level (for example, the voltage level of the voltage Vss), the precharge unit 70 precharges the node N1 to a voltage obtained by "the voltage Vss+(the threshold voltage of the P-type transistor 71)+(the threshold voltage of the P-type transistor 72)." Here, the voltage to be precharged to the node N1 is a voltage lower than the threshold voltage of the P-type transistor 62.

In a case where the output of the output terminal To transitions from a predetermined voltage to the voltage Vss, the reset unit 80 resets (discharges) the voltage at the gate terminal (node N1) of the P-type transistor 62 to a voltage at which the P-type transistor 62 enters the non-conductive state. For example, based on the output signal of the output terminal To fed back as a control signal for the output control unit 7, the reset unit 80 performs control to have the gate voltage of the P-type transistor 62 transition to the voltage Vdd so that the P-type transistor 62 enters the non-conductive state.

Additionally, the reset unit 80 includes an N-type transistor 81 and an N-type transistor 82.

Regarding the P-type transistor 81 (reset transistor), a drain terminal is connected to the node N1, a gate terminal is connected to the output terminal To, and a source terminal is connected to a power supply line $L_{Vdd}$ of the voltage Vdd. In a case where the output of the output terminal To is at the voltage Vdd, the P-type transistor 81 enters the non-conductive state, and makes the node N1 in the floating state. Additionally, in a case where the output of the output terminal To is at the voltage Vss, the P-type transistor 81 enters the conductive state, and discharges, so as to reset, the node N1 to the voltage Vdd. Here, the driving capability (on-resistance) of the P-type transistor 81 is adjusted so as to have the node N1 transition to the voltage Vdd after the output of the output terminal To reliably transitions to the voltage Vss. Here, the driving capability (on-resistance) of the P-type transistor 81 is adjusted so that after the output of the output terminal To transitions to the voltage Vss, the P-type transistor 81 resets (discharges) the node N1 to the voltage Vdd over a predetermined period of time.

Regarding the P-type transistor 82, a drain terminal is connected to the node N2, a gate terminal is connected to the output terminal To, and a source terminal is connected to the power supply line $L_{Vdd}$ of the voltage Vdd. In a case where the output of the output terminal To is substantially at the voltage Vdd, the P-type transistor 82 enters the non-conductive state, and makes the node N2 in a floating state. Additionally, in a case where the output of the output terminal To is at the voltage Vss, the P-type transistor 82 enters the conductive state, and discharges, so as to reset, the node N2 to the voltage Vdd.

The output unit 60 is a circuit having a bootstrap configuration, and includes a resistor 61, a P-type transistor 62, and a capacitor 63. The output unit 60 performs a bootstrap operation that is an operation for outputting the voltage Vss to the output terminal To when the output of the output terminal To transitions from the H-level to the L-level.

The resistor 61 (current limiting element) is connected between the power supply line $L_{Vss}$ supplied with the voltage Vss and the output terminal To, and supplies the voltage Vss by a predetermined current from the power supply line $L_{Vss}$ to the output terminal To.

Regarding the P-type transistor 62 (output transistor), a source terminal is connected to the signal line of the clock signal CKB, a gate terminal (control terminal) is connected to the node N1, and a drain terminal is connected to the output terminal To. In accordance with a voltage supplied from the output control unit 7 to the gate terminal, the P-type transistor 62 outputs the input clock signal CKB to the output terminal To. The P-type transistor 62 enters the conductive state in a case where the gate voltage is equal to or lower than the threshold voltage. Additionally, the P-type transistor 62 enters the non-conductive state in a case where the gate voltage exceeds the threshold voltage.

The P-type transistor 62 outputs the voltage Vdd to the drain terminal in a case where the voltage Vdd is supplied to the clock signal CKB in the conductive state. Additionally, in a case where the voltage Vss is supplied to the clock signal CKB in the conductive state where a voltage equal to or higher than the voltage Vss is supplied to the gate terminal, the P-type transistor 62 outputs to the drain terminal, a voltage increased from the voltage of the gate terminal by the threshold voltage. In other words, in order to output the voltage Vss to the drain terminal of the P-type transistor 62, it is necessary to supply to the gate terminal, a voltage that is lower than the voltage Vss by at least the threshold voltage (i.e., a voltage equal to or lower than "the voltage Vss-the threshold voltage").

The capacitor 13 (capacitance element) is connected between the output terminal To and the gate terminal (node N1) of the P-type transistor 62. In order to supply to the gate terminal of the P-type transistor 62, the above-described voltage equal to or lower than "the voltage Vss-the threshold voltage," the capacitor 13 charges the node N1 connected with the gate terminal of the P-type transistor 62, when the output of the output terminal To transitions from the H-level to the L-level.

Next, operation of the pulse generation circuit 1b according to the present embodiment will be described.

Figure 14:
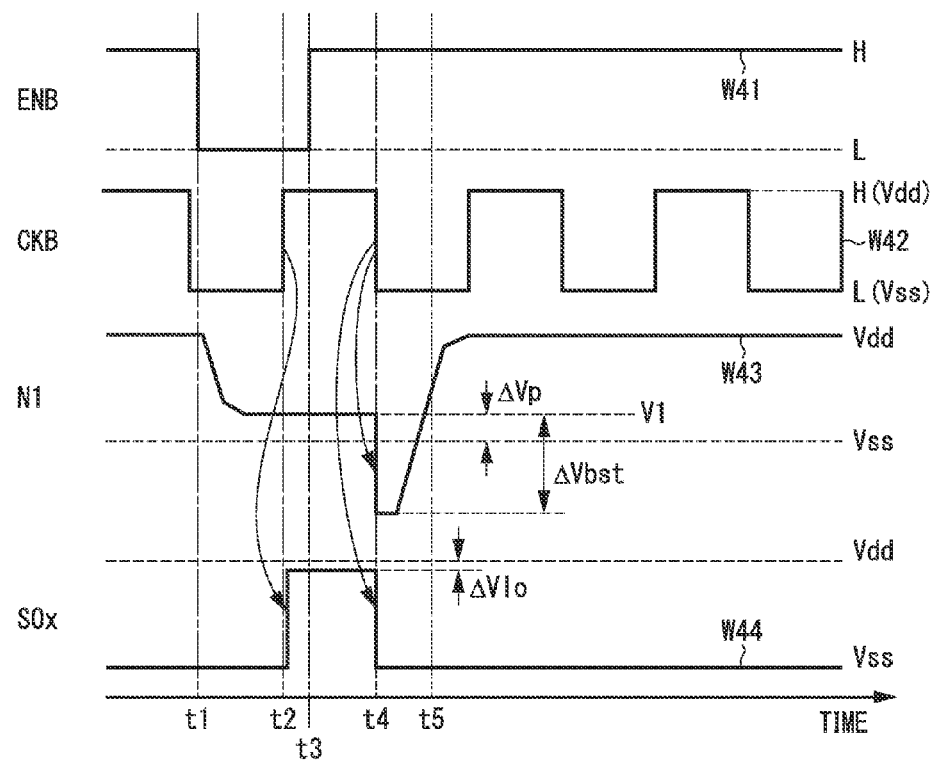
FIG. 14 is a time chart showing an example of operation of the pulse generation circuit according to the fifth embodiment.

FIG. 14 is a time chart showing an example of the operation of the pulse generation circuit 1b according to the present embodiment.

In FIG. 14, a waveform W41 represents a voltage waveform of the control signal ENB. A waveform W42 represents a voltage waveform of the clock signal CKB (clock signal). Additionally, a waveform W43 represents a voltage waveform at the node N1 shown in FIG. 13. A waveform W44 represents a voltage waveform of the output signal SOx to be output to the output terminal To.

Additionally, in this figure, a horizontal axis represents time, and a vertical axis represents a signal level (voltage) of each waveform.

Operation of the pulse generation circuit 1b according to the present embodiment is the logical inversion of the operation of the pulse generation circuit 1 according to the first embodiment shown in FIG. 2. In other words, in FIG. 14, the input signals EN and CK shown in FIG. 2 are replaced with the input signals ENB and CKB that are the logically inversion of the input signals EN and CK. Additionally, as the output signal SOx, a pulse signal at the H-level is output.

First, when the control signal ENB transitions from the H-level to the L-level at time t1, the output control unit 7 of the pulse generation circuit 1b initiates precharge to the node N1. In other words, in this case, the P-type transistor 71 of the precharge unit 70 enters the conductive state, and the P-type transistor 71 supplies to the node N2, a voltage increased from the voltage Vss by the threshold voltage of the P-type transistor 71. Additionally, as a result, the diode-connected P-type transistor 72 enters the conductive state, and precharges the node N1 to a predetermined voltage V1. Here, the voltage V1 represents a voltage "V1=voltage Vss+ΔVp," and the voltage ΔVp is a voltage determined by the threshold voltage of the P-type transistor 71 and the threshold voltage of the P-type transistor 72.

Additionally, at time t1, the clock signal CKB is at the L-level. For this reason, when the node N1 becomes at a voltage equal to or higher than the threshold voltage of the P-type transistor 62, the pulse generation circuit 1b outputs the voltage Vss (L-level) to the output terminal To.

Then, at time t2, the clock signal CKB transitions from the L-level to the H-level, and the H-level of the clock signal CKB is applied to the source terminal of the P-type transistor 62 of the output unit 60. The P-type transistor 62 enters the conductive state by the node N1 being precharged to the voltage equal to or lower than the threshold voltage of the P-type transistor 62. Then, the P-type transistor 62 supplies the voltage Vdd (H-level) of the clock signal CKB to the output terminal To. Here, the output terminal To is supplied with the voltage Vss via the resistor 61. For this reason, the output signal SOx becomes at a voltage "Vdd−ΔVlo" that is determined by a ratio of the on-resistance value of the P-type transistor 62 and the resistance value of the resistor 61. Thus, in the case where the clock signal CKB transitions from the L-level to the H-level, the pulse generation circuit 1b has the output signal SOx transition from the voltage Vss (L-level) to the voltage "Vdd−ΔVlo" (H-level).

Here, the output signal SOx is at the signal level of the voltage Vss in the period from time t1 to time t2. For this reason, the P-type transistor 81 and the P-type transistor 82 of the reset unit 80 enters the conductive state. Here, the driving capabilities of the P-type transistor 71 and the P-type transistor 72 of the precharge unit 70 are sufficiently higher than the driving capabilities of the P-type transistor 81 and the P-type transistor 82. For this reason, the node N1 and the node N2 are precharged to a voltage equal to or lower than the threshold voltage of the P-type transistor 62.

Next, when the control signal ENB transitions from the L-level to the H-level at time t3, the output control unit 7 of the pulse generation circuit 1b terminates the precharge to the node N1. In this case, the output of the output terminal To is at the H-level (voltage "Vdd−ΔVlo"). For this reason, the P-type transistor 81 and the P-type transistor 82 are in the non-conductive state. Additionally, by the control signal ENB transitioning to the H-level, the P type transistor 71 and the P-type transistor 72 of the precharge unit 70 enter the non-conductive state. For this reason, the node N1 enters the floating state while being precharged to the voltage equal to or lower than the threshold voltage of the P-type transistor 62.

Next, when the clock signal CKB transitions from the H-level to the L-level at time t4, the output of the P-type transistor 62 of the output unit 60 changes to the L-level, in response to the clock signal CKB. Then, by the output of the P-type transistor 62 changing to the L-level, the output unit 60 performs the bootstrap operation via the capacitor 63, and the node N1 becomes at a voltage lower than the precharged voltage by the voltage ΔVbst. Thus, the voltage lower than "the voltage Vss−the threshold voltage" is supplied to the gate terminal. For this reason, the P-type transistor 62 outputs to the output terminal To, a voltage equal to the voltage Vss. In other words, the P-type transistor 62 transfers, by the bootstrap operation, the L-level of the clock signal CKB to the output signal SOx without voltage loss. Thus, in the case where the clock signal CKB transitions from the H-level to the L-level, the pulse generation circuit 1b has the output signal SOx transition from the voltage "Vdd−ΔVlo" (H-level) to the voltage Vss (L-level).

Additionally, here, the output of the output terminal To is at the L-level (voltage Vss). Therefore, the P-type transistor 81 and the P-type transistor 82 enter the conductive state. For this reason, the P-type transistor 81 and the P-type transistor 82 reset (discharge) the nodes N1 and N2 to the voltage Vdd over a predetermined period of time. In other words, after the output of the output terminal To transitions to the voltage Vss, the reset unit 80 resets (discharges) the node N1 to the voltage Vdd over the predetermined period of time. Here, the predetermined period may be a period from time t4 to time t5.

Next, at time t5, the gate terminal of the P-type transistor 62, which is the node N1, becomes at a voltage higher than the threshold voltage of the P-type transistor 62, and thus the P-type transistor 62 enters the non-conductive state. Thus, the output unit 60 terminates the bootstrap operation. Then, the voltage Vss is supplied by a predetermined current from the power supply line $L_{Vss}$ to the output terminal To via the resistor 61, thus maintaining the output signal SOx of the output terminal To at the voltage Vss.

Thus, after time t4, the output signal SOx is maintained at the voltage Vss.

As described above, the pulse generation circuit 1b according to the present embodiment is configured with transistors of a single conductivity type (for example, P-type transistors) and includes the output unit 60 and the output control unit 7. The output unit 60 includes the resistor 61 that supplies, by the predetermined current, the voltage Vss from the power supply line $L_{Vss}$ supplied with the voltage Vss (first voltage) to the output terminal To, and performs the bootstrap operation that outputs the voltage Vss to the output terminal To. Then, when the output of the output terminal To transitions to the voltage Vss, the output control unit 7 initiates the bootstrap operation. After the output of the output terminal To transitions to the voltage Vss, the output control unit 7 terminates the bootstrap operation, and performs control so as to output the voltage Vss from the resistor 61 to the output terminal To. Additionally, the output unit 60 includes the P-type transistor 62 and the capacitor 63. The P-type transistor 62 outputs the input clock signal CKB to the output terminal To in accordance with the voltage of the gate terminal.

Thus, the pulse generation circuit 1b according to the present embodiment is configured by replacing the transistors of the pulse generation circuit 1 according to the first embodiment with P-type transistors while regarding the first voltage as the voltage Vss, thus achieving a similar effect to that of the first embodiment.

Next, a pulse generation circuit 1c according to a sixth embodiment will be described with reference to the drawings.

[Sixth Embodiment]

Figure 15:
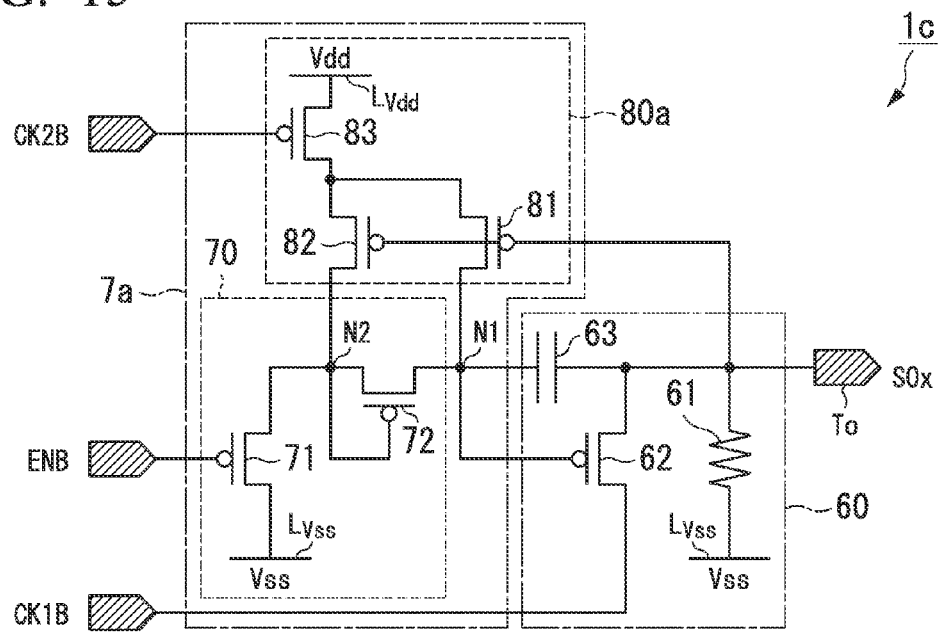
FIG. 15 is a block diagram showing an example of a pulse generation circuit according to a sixth embodiment.

FIG. 15 is a block diagram showing an example of the pulse generation circuit 1c according to the sixth embodiment.

In the present embodiment, the pulse generation circuit 1c differs from the fifth embodiment in that the reset unit 80 of the pulse generation circuit 1b according to the fifth embodiment is added with a P-type transistor 83 to be controlled by a clock signal CK2B (clock signal) that is a second input signal. Additionally, in the present embodiment, a clock signal CK1B that is a first input signal is input to the pulse generation circuit 1c, in place of the clock signal CKB.

In FIG. 15, the pulse generation circuit 1c includes the output unit 60 and an output control unit 7a.

Here, in FIG. 15, the same reference numerals are appended to the same configurations as those shown in FIG. 13, and description thereof is omitted.

As described above, the output control unit 7a according to the present embodiment differs from the output control unit 7 according to the fifth embodiment in that a reset unit 80a includes a P-type transistor 83. Additionally, the output control unit 7a according to the present embodiment is configured by replacing the transistors of the output control unit 2a of the second embodiment with P-type transistors. The P-type transistor 83 of the reset unit 80a corresponds to the N-type transistor 33 of the second embodiment.

Regarding the P-type transistor 83 (second reset transistor), a drain terminal is connected to the Node N3, a gate terminal is connected to the clock signal CK2B, and a source terminal is connected to the power supply line $L_{Vdd}$ of the voltage Vdd. The P-type transistor 83 enters a conductive-state in a case where the clock signal CK2B is at the H-level, and makes the Node N1 and the Node N2 in a floating state. Additionally the P-type transistor 83 enters a conductive-state in a case where the clock signal CK2B is at the L-level, and resets (discharges) the nodes N1 and N2 to the voltage Vdd. Here, the clock signal CK2B (second clock signal) is a signal that differs in phase from the clock signal CK1B (first clock signal).

Next, operation of the pulse generation circuit 1c according to the present embodiment will be described.

Figure 16:
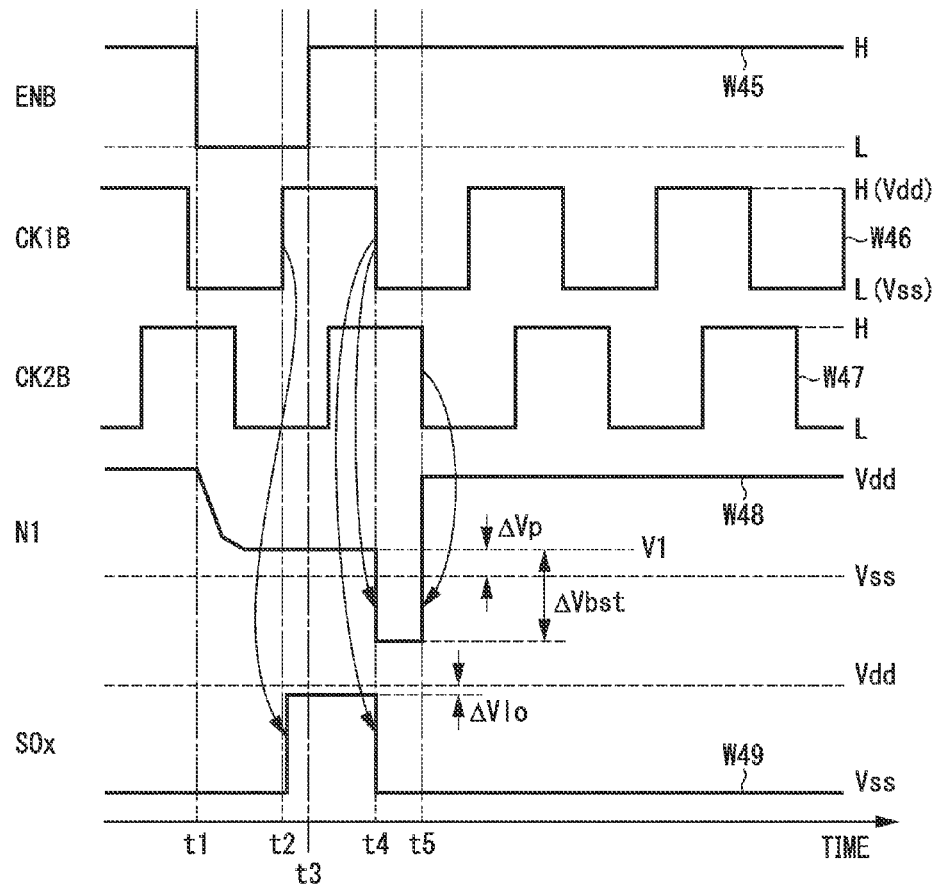
FIG. 16 is a time chart showing an example of operation of the pulse generation circuit according to the sixth embodiment.

FIG. 16 is a time chart showing an example of the operation of the pulse generation circuit 1c according to the present embodiment.

In FIG. 16, a waveform W45 represents a voltage waveform of the control signal ENB. A waveform W46 represents a voltage waveform of the clock signal CK1B (first clock signal). A waveform W47 represents a voltage waveform of the clock signal CK2B (second clock signal). Additionally, a waveform W48 represents a voltage waveform at the node N1 shown in FIG. 15. A waveform W49 represents a voltage waveform of the output signal SOx to be output to the output terminal To according to the present embodiment.

Additionally, in this figure, a horizontal axis represents time, and a vertical axis represents a signal level (voltage) of each waveform.

In FIG. 16, operation from time t1 to time t4 is similar to the operation of the fifth embodiment shown in FIG. 14, except that the clock signal CK1B is used in place of the clock signal CKB, and thus description thereof will be omitted here.

Additionally, the operation of the pulse generation circuit 1c according to the present embodiment shown in FIG. 16 is the logical inversion of the operation of the pulse generation circuit 1a according to the second embodiment shown in FIG. 4, and therefore description thereof is omitted here.

As described above, the pulse generation circuit 1c according to the present embodiment is configured by replacing the transistors of the pulse generation circuit 1a of the second embodiment with P-type transistors while regarding the first voltage as the voltage Vss, thus achieving a similar effect to that of the second embodiment.

Next, an example of a case where the above-described pulse generation circuit 1b according to the fifth embodiment is applied to a shift register of the display device 100 will be described with reference to the drawings.

[Seventh Embodiment]

In the present embodiment, the display device 100 is similar to the display device 100 shown in FIG. 5, except that a shift register circuit 6b is included in place of the shift register circuit 6, and therefore description thereof is omitted here.

Figure 17:
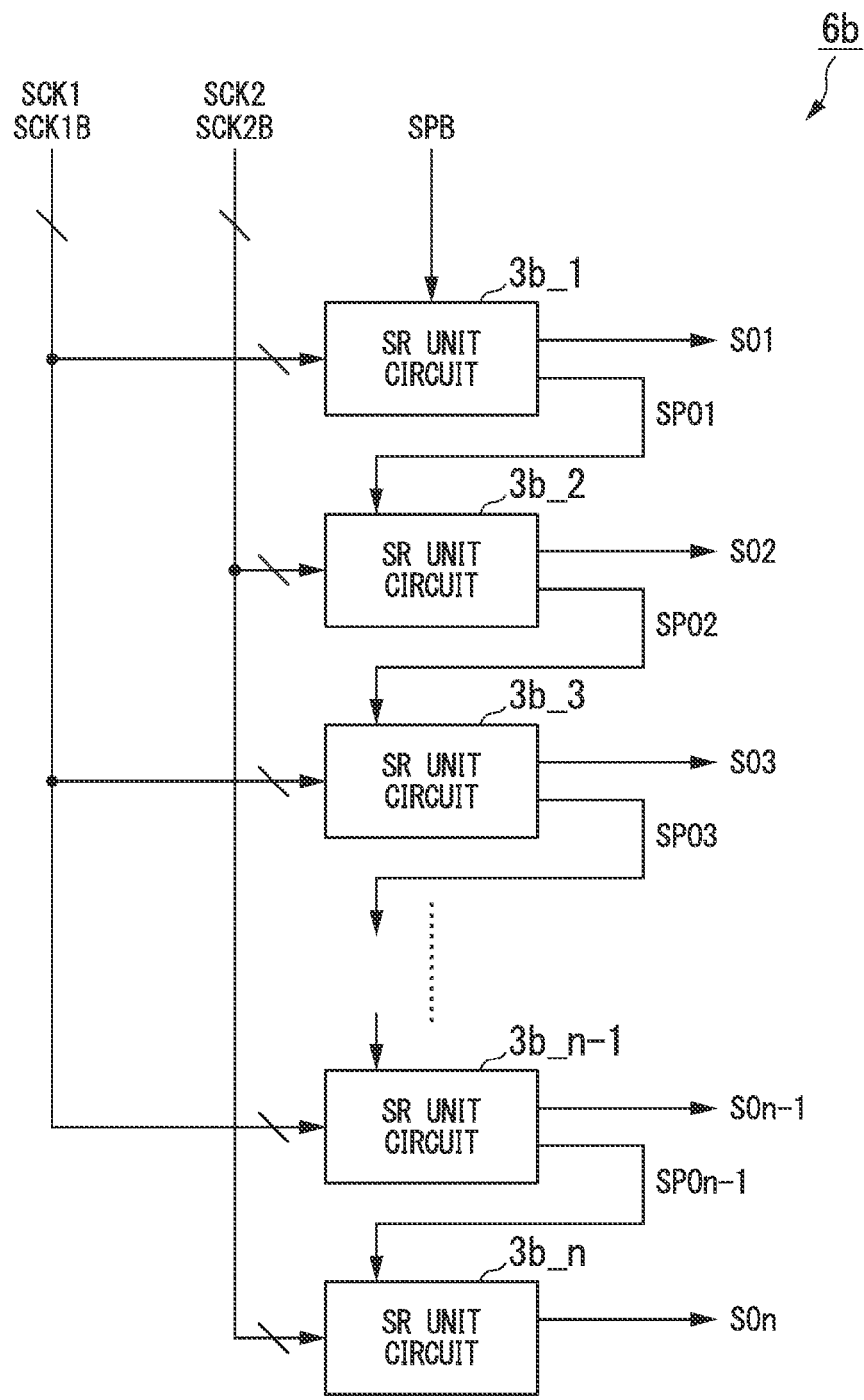
FIG. 17 is a block diagram showing an example of a shift register circuit according to a seventh embodiment.

FIG. 17 is a block diagram showing an example of the shift register circuit 6b according to the present embodiment.

In this figure, the shift register circuit 6b includes, for example, n SR unit circuits 3b (3b_1 to 3b_n), and is a shift register including the SR unit circuits 3b connected in multiple stages.

Here, in the present embodiment, the shift register circuit 6b is configured with P-type transistors, a source start pulse SPB that is the logical inversion of the source start pulse SP is input to the SR unit circuit 3b_1 in the first-stage. Other configurations are similar to the shift register circuit 6 shown in FIG. 6, except that the SR unit circuit 3 is replaced with the SR unit circuit 3b.

Next, a configuration of the SR unit circuit 3b according to the present embodiment will be described.

Figure 18:
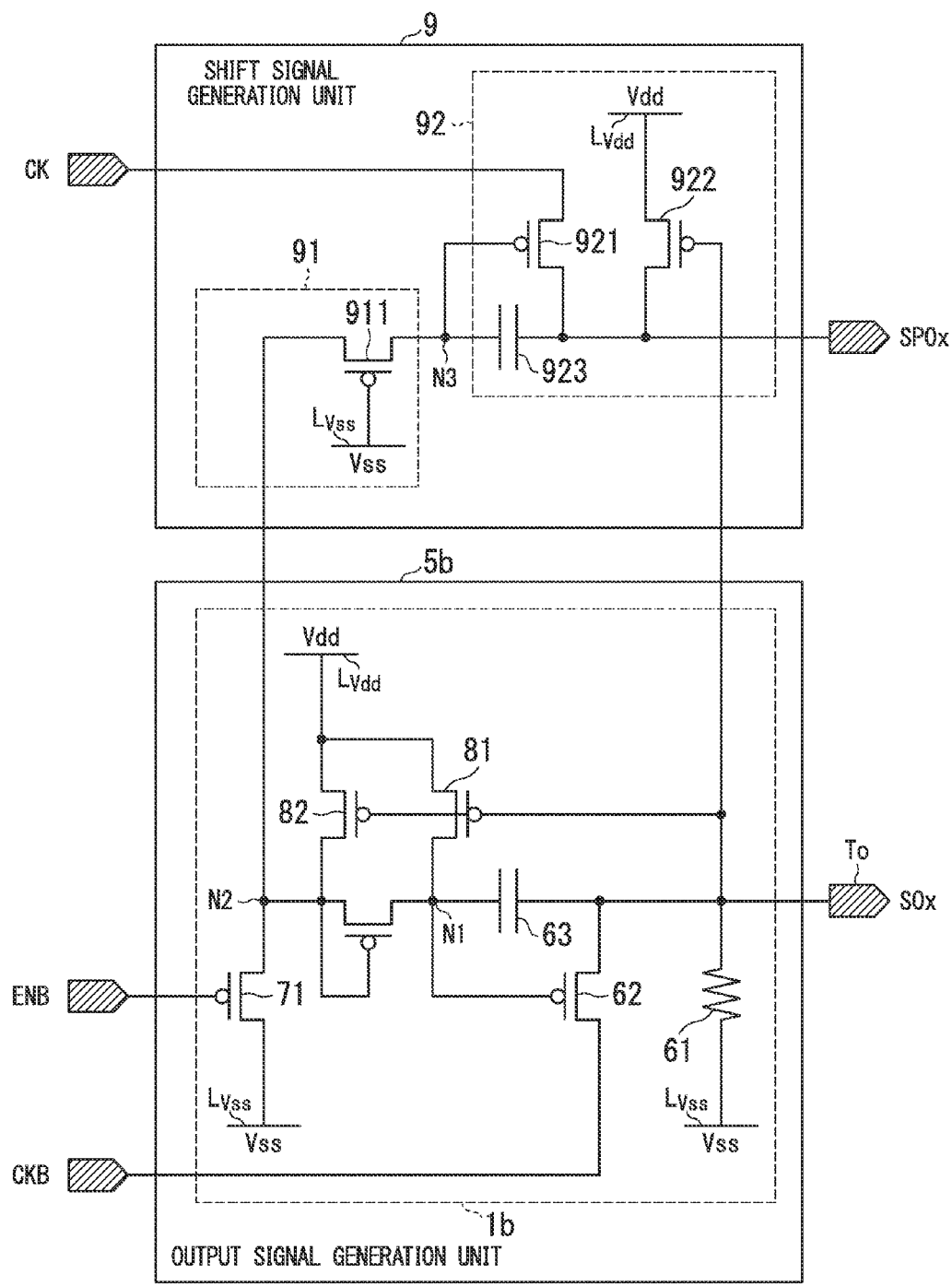
FIG. 18 is a block diagram showing an example of an SR unit circuit according to the seventh embodiment.

FIG. 18 is a block diagram showing an example of the SR unit circuit 3b according to the present embodiment.

In this figure, the SR unit circuit 3b includes an output signal generation unit 5b and a shift signal generation unit 9.

The output signal generation unit 5b includes the pulse generation circuit 1b according to the fifth embodiment. A clock signal SCK1B (SCK2B, SCK1, or SCK2) is input to the clock signal CKB. In response to clock signal SCK1B (SCK2B, SCK1, or SCK2), the output signal generation unit 5b outputs an output signal SOx to the output terminal To. Here, the configuration of the pulse generation circuit 1b is similar to the configuration shown in FIG. 13, and description thereof is omitted here.

The shift signal generation unit 9 outputs a shift output signal SPOx in response to the output signal SOx. For example, the clock signal SCK1 (SCK2, SCK1B, or SCK2B) is input to the clock signal CK, and the shift signal generation unit 9 outputs a shift output signal SPOx that is a logical inversion signal of the output signal SOx.

Additionally, the shift signal generation unit 9 includes a shift output control unit 91 and a shift output unit 92.

The shift output unit 92 performs a bootstrap operation based on the control signal output from the shift output control unit 91. Utilizing the bootstrap operation, the shift output unit 92 outputs a signal at a voltage level of the voltage Vss, in response to the clock signal CK. The shift output unit 92 includes, for example, a P-type transistor 921, a P-type transistor 922, and a capacitor 923.

In accordance with the voltage of the gate terminal, the P-type transistor 921 (first output transistor) outputs as a shift output signal SPOx, an inverted clock signal SCK1 (SCK2, SCK1B, or SCK2B) that is a clock signal in the phase opposite to that of the clock signal SCK1B (SCK2B, SCK1, or SCK2). Regarding the P-type transistor 921, for example, a source terminal is connected to a signal line of the clock signal CK, a gate terminal (control terminal) is connected to the node N3, and a drain terminal is connected to a signal line of the shift output signal SPOx.

The P-type transistor 922 (second output transistor) is connected between the power supply line $L_{Vdd}$ supplied with the voltage Vdd and a signal line of the shift output signal SPOx, and a gate terminal thereof is connected to the output terminal To. In other words, regarding the P-type transistor 922, for example, a source terminal is connected to the power supply line $L_{Vdd}$, the gate terminal is connected to the output terminal To, and a drain terminal is connected to the signal line of the shift output signal SPOx.

The capacitor 923 (capacitance element) is connected between the signal line of the shift output signal SPOx and the gate terminal (node N3) of the P-type transistor 921. In order to supply a voltage equal to or lower than "the voltage Vss–the threshold voltage" to the gate terminal of the P-type transistor 921, the capacitor 923 charges the node N3 connected with the gate terminal of the P-type transistor 921, when the shift output signal SPOx transitions from the H-level to the L-level.

The shift output control unit 91 controls the voltage of the gate terminal of the P-type transistor 921, so that the P-type transistor 921 is in the conductive state at least in the period in which the shift output signal SPOx outputs the voltage Vss.

Additionally, the shift output control unit 91 includes a P-type transistor 911.

Regarding the P-type transistor 911 (third precharge transistor), a drain terminal is connected to the node N2, a gate terminal is connected to the power supply line $L_{Vss}$, and a source terminal is connected to the node N3. The P-type transistor 911 supplies (precharges) to the node N3, the voltage supplied to the node N2.

Here, after the voltage of the node N3 is precharged to a voltage lower than the threshold voltage at which the P-type transistor 921 enters the conductive state, when the shift output signal SPOx transitions from the voltage Vdd to the voltage Vss by the bootstrap operation, the voltage of the node N3 becomes a voltage lower than the voltage Vss by at least the threshold voltage. Additionally, when the shift output signal SPOx transitions from the voltage Vss to the voltage Vdd by the bootstrap operation, the voltage of the node N3 returns to the precharge voltage. At the same time, the output terminal To transitions from the H-level to the L-level, and thereby the P-type transistor 82 enters the conductive state. Then, the node N2 becomes at the Vdd level, and thereby the shift output signal SPOx eventually becomes at the voltage Vdd.

Next, operation of the shift register circuit 6b according to the present embodiment will be described.

Figure 19:
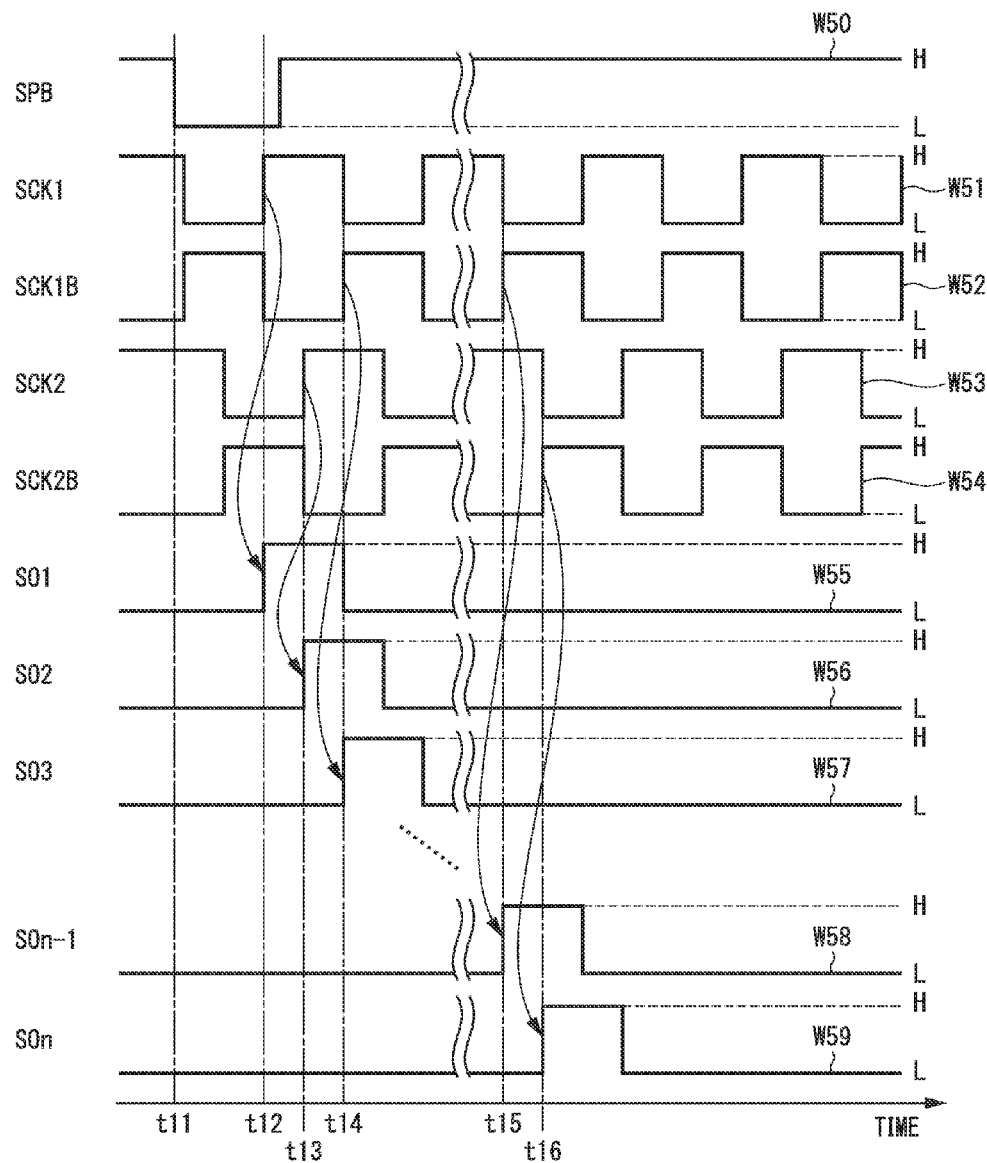
FIG. 19 is a time chart showing an example of operation of the shift register circuit according to the seventh embodiment.

FIG. 19 is a time chart showing an example of the operation of the shift register circuit 6b according to the present embodiment.

In FIG. 19, waveforms W50 to W54 respectively represent a voltage waveform of the source start pulse SPB, a voltage waveform of the clock signal SCK1, a voltage waveform of the clock signal SCK1B, a voltage waveform of the clock signal SCK2, and a voltage waveform of the clock signal SCK2B. Additionally, waveforms W55 to W57 respectively represent voltage waveforms of the output signals SO1 to SO3. Waveforms W58 and W59 represent voltage waveforms of the output signal SOn−1 and SOn. Further, in this figure, a horizontal axis represents time, and a vertical axis represents a signal level (voltage) of each waveform.

Operation of the shift register circuit 6b according to the present embodiment shown in FIG. 19 is the logical inversion of the operation of the shift register circuit 6 according to the third embodiment shown in FIG. 8 (see time t11 to time t16). In other words, the shift register circuit 6b initiates the shift operation from the fall of the source start pulse SPB, sequentially outputs the output signals in the odd-numbered stages (SO1, SO3, . . . ) in response to the rise (or fall) of the clock signal SCK1, and sequentially outputs the output signals in the even-numbered stages (SO2, . . . ) in response to the rise (or fall) of the clock signal SCK2.

Next, operation of the SR unit circuit 3b of the shift register circuit 6b according to the present embodiment will be described.

Figure 20:
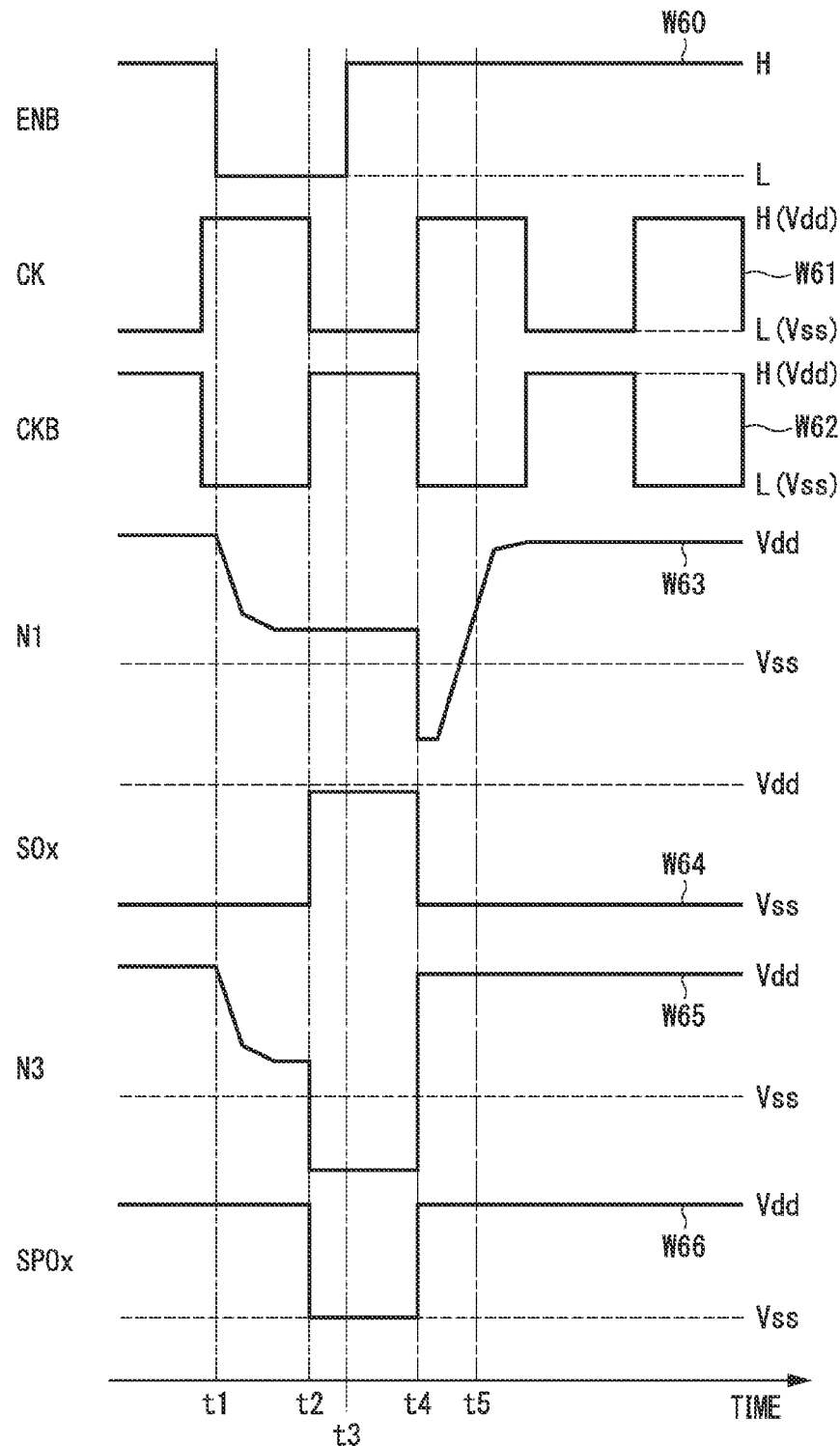
FIG. 20 is a time chart showing an example of the operation of the SR unit circuit according to the seventh embodiment.

FIG. 20 is a time chart showing an example of the operation of the SR unit circuit 3b according to the present embodiment.

In FIG. 20, a waveform W60 represents a voltage waveform of the input signal ENB (the source start pulse SP or the shift output signal SPOx in the previous stage). Additionally, a waveform W61 represents a voltage waveform of the clock signal CK (clock signal SCK1, SCK2, SCK1B, or SCK2B). A waveform W62 represents a voltage waveform of the clock signal CKB (clock signal SCK1B, SCK2B, SCK1, or SCK2). Further, a waveform W63 represents a voltage waveform at the node N1 shown in FIG. 18. A waveform W64 represents a voltage waveform of the output signal SOx to be output to the output terminal To. Moreover, a waveform W65 represents a voltage waveform at the node N3 shown in FIG. 18. A waveform W66 represents a voltage waveform of the shift output signal SPOx. Additionally, in this figure, a horizontal axis represents time, and a vertical axis represents a signal level (voltage) of each waveform.

Operation of the SR unit circuit 3b according to the embodiment shown in FIG. 20 is the logical inversion of the operation of the SR unit circuit 3 according to the third embodiment shown in FIG. 9 (see time t1 to time t5).

As described above, the shift register circuit 6b according to the present embodiment is configured by replacing the transistors of the shift register circuit 6 according to the third embodiment with P-type transistors, while regarding the first voltage as the voltage Vss, thereby achieving a similar effect to that of the third embodiment.

Next, as an alternative embodiment different from the seventh embodiment, an example of a case where the above-described pulse generation circuit 1c according to the sixth embodiment is applied to the shift register of the display device 100 will be described with reference to the drawings.

[Eighth Embodiment]

First, a configuration of a shift register circuit 6c according to the present embodiment will be described.

Figure 21:
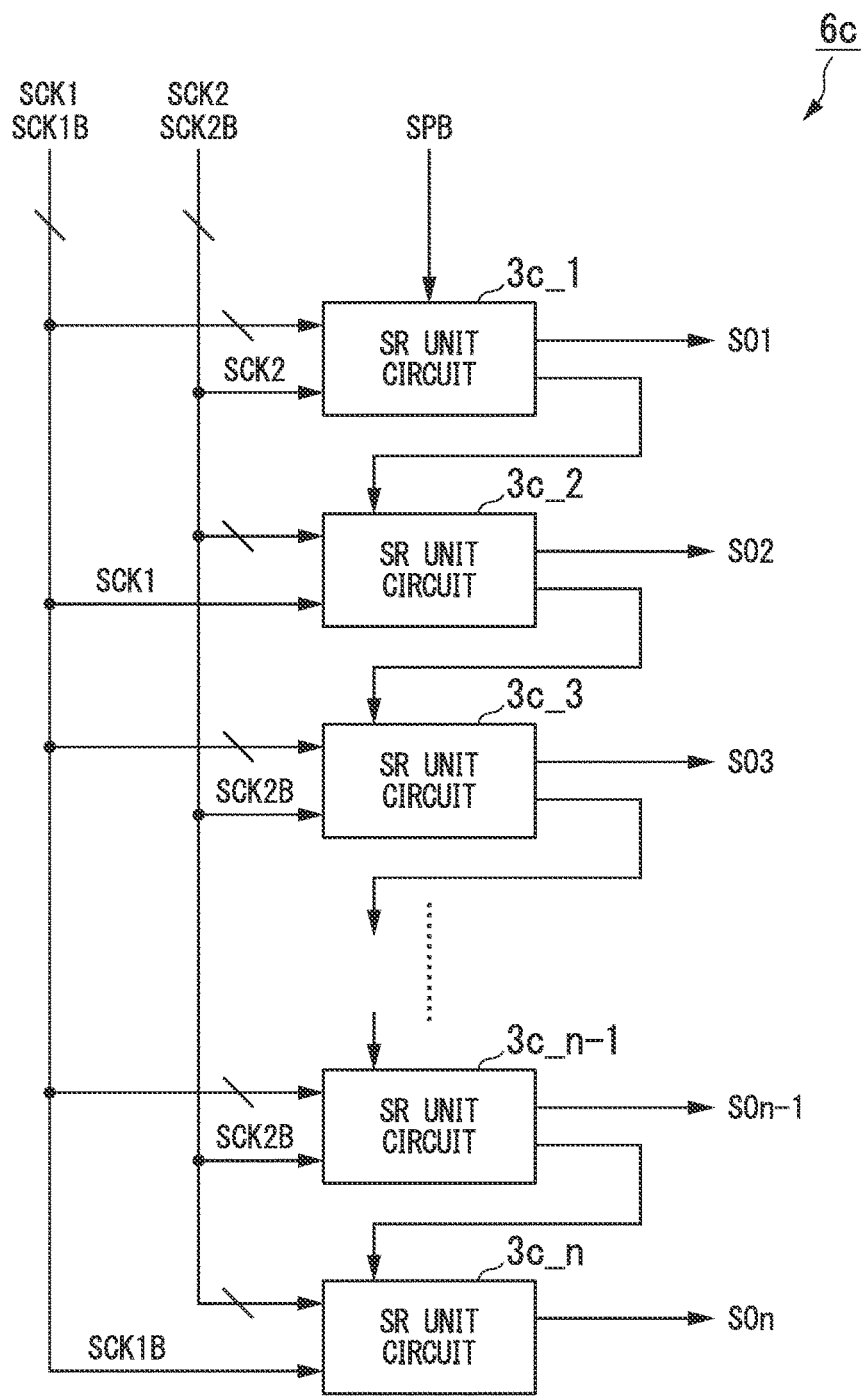
FIG. 21 is a block diagram showing an example of a shift register circuit according to an eighth embodiment.

FIG. 21 is a block diagram showing an example of the shift register circuit 6c according to the present embodiment.

In this figure, the shift register circuit 6c includes, for example, n SR unit circuits 3c (3c_1 to 3c_n), and is a shift register including the SR unit circuits 3c connected in multiple stages.

Here, the display device 100 according to the present embodiment is similar to the display device 100 shown in FIG. 5, except that the shift register circuit 6c is included in place of the shift register circuit 6.

Additionally, in the present embodiment, the shift register circuit 6c is configured with P-type transistors. For this reason, a source start pulse SPB that is the logical inversion of the source start pulse SP is input to the SR unit circuit 3c_1 in the first-stage. Other configurations are similar to those of the shift register circuit 6a shown in FIG. 10, except that the SR unit circuit 3a is replaced with the SR unit circuit 3c.

The shift register circuit 6c according to the present embodiment includes n SR unit circuits 3c (3c_1 to 3c_n). Here, the n SR unit circuits 3c receive any one of a plurality of groups of signals which are (clock signals SCK1, SCK1B, and SCK2), (SCK2, SCK2B, and SCK1), (clock signals SCK1B, SCK1, and SCK2B), and (SCK2B, SCK2, and SCK1B).

Next, a configuration of the SR unit circuit 3c according to the present embodiment will be described.

Figure 22:
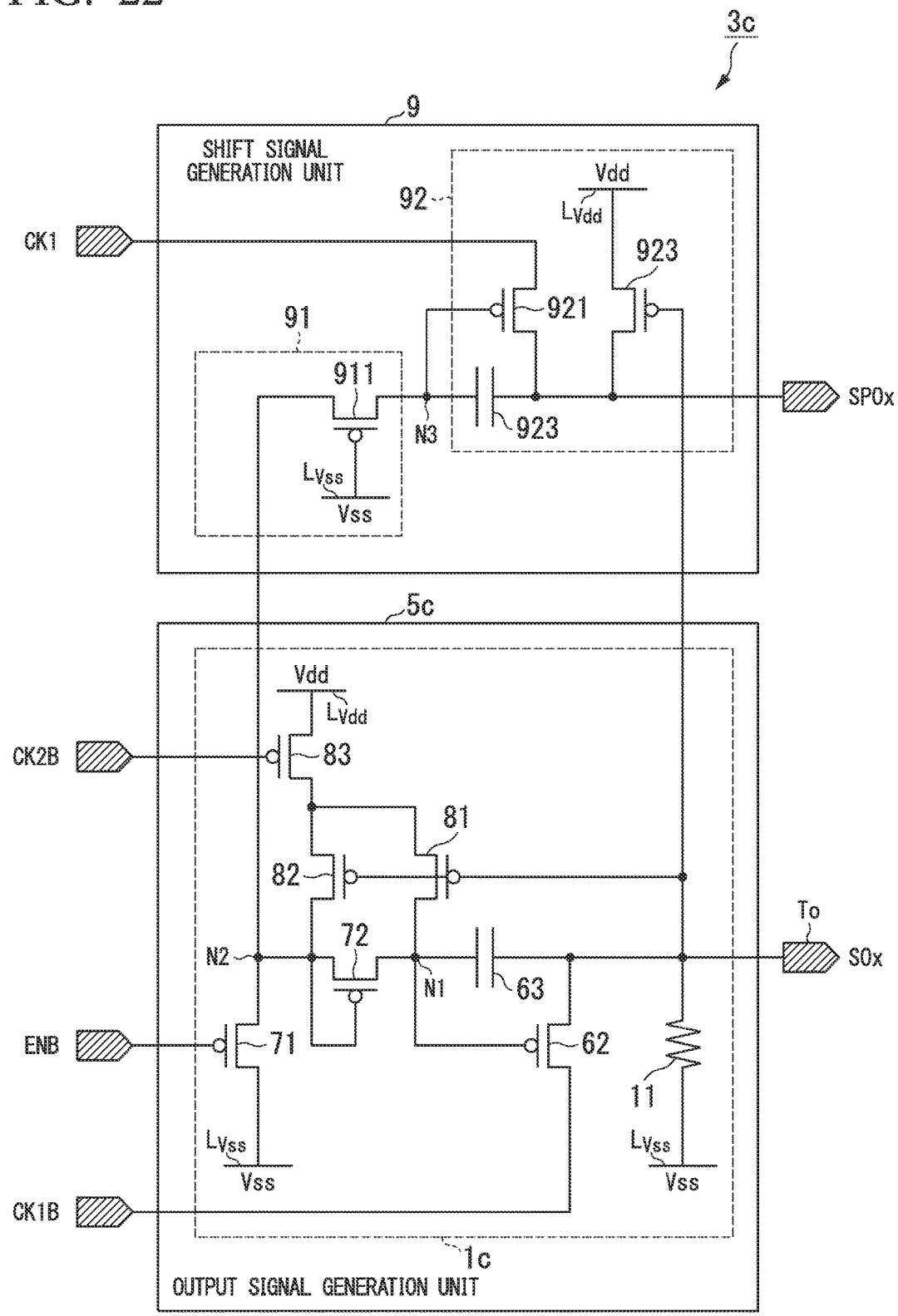
FIG. 22 is a block diagram showing an example of an SR unit circuit according to the eighth embodiment.

FIG. 22 is a block diagram showing an example of the SR unit circuit 3c according to the present embodiment.

In this figure, the SR unit circuit 3c includes an output signal generation unit 5c and the shift signal generation unit 9.

The output signal generation unit 5c includes the pulse generation circuit 1c according to the sixth embodiment. A clock signal SCK1B (SCK2B, SCK1, or SCK2) is input to the clock signal CK1B. In response to a clock signal SCK1B (SCK2B, SCK1, or SCK2), the output signal generation unit 5c outputs an output signal SOx to the output terminal To. Here, the configuration of the pulse generation circuit 1c is similar to the configuration shown in FIG. 15, and description thereof is omitted here.

Additionally, in FIG. 22, the same reference numerals are appended to the same configurations as those shown in FIG. 18, and description thereof is omitted here.

Next, operation of the shift register circuit 6c according to the present embodiment will be described.

The operation of the shift register circuit 6c according to the present embodiment is similar to the operation of the shift register circuit 6b shown in FIG. 19, and therefore description thereof will be omitted here.

Next, operation of the SR unit circuit 3c of the shift register circuit 6c according to the present embodiment will be described.

Figure 23:
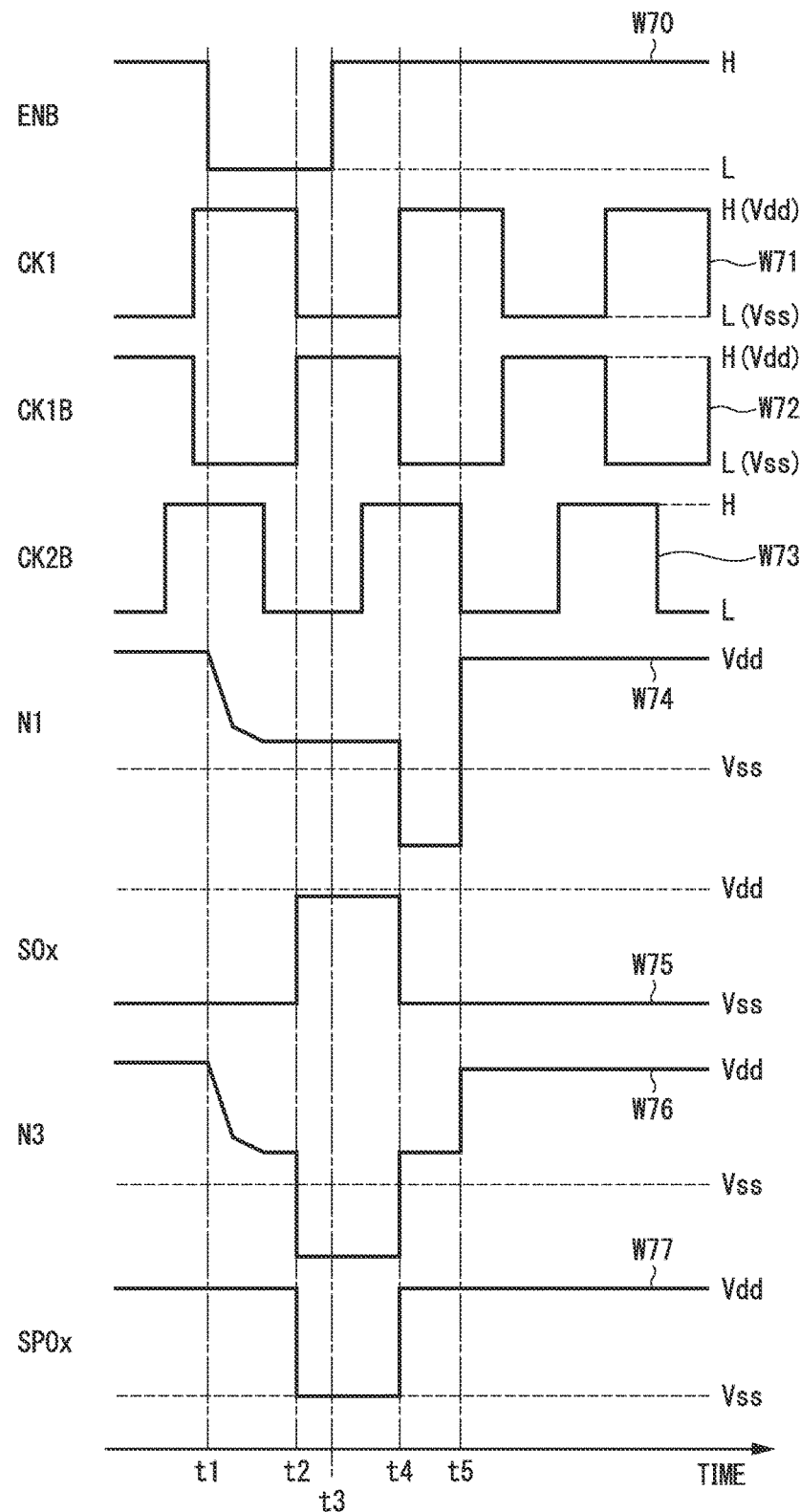
FIG. 23 is a time chart showing an example of operation of the SR unit circuit according to the eighth embodiment.

FIG. 23 is a time chart showing an example of the operation of the SR unit circuit 3c according to the present embodiment.

In FIG. 23, waveforms W70 to W73 respectively represent a voltage waveform of the input signal ENB (the source start pulse SPB or the shift output signal SPOx in the previous stage), a voltage waveform of the clock signal CK1, a voltage waveform of the clock signal CK1B, and a voltage waveform of the clock signal CK2B. Additionally, a waveform W74 represents a voltage waveform at the node N1 shown in FIG. 22. Further, a waveform W75 represents a voltage waveform of the output signal SOx to be output to the output terminal To. Moreover, a waveform W76 represents a voltage waveform at the node N3 shown in FIG. 22. Additionally, a waveform W77 represents a voltage waveform of the shift output signal SPOx.

Additionally, in this figure, a horizontal axis represents time, and a vertical axis represents a signal level (voltage) of each waveform.

Operation of the SR unit circuit 3c according to the embodiment shown in FIG. 23 is the logical inversion of the operation of the SR unit circuit 3a according to the fourth embodiment shown in FIG. 12 (see time t1 to time t5).

As described above, the shift register circuit 6c according to the present embodiment is configured by replacing the transistors of the shift register circuit 6a according to the fourth embodiment with P-type transistors, while regarding the first voltage as the voltage Vss, thereby achieving a similar effect to that of the fourth embodiment.

Here, the present invention is not limited to the above embodiments, and may be modified without departing from the scope of the present invention.

For example, in the above embodiments, the examples of the case where the SR unit circuit 3 (3a to 3c) includes the shift signal generation unit 4 (9) have been described. However, as shown in FIG. 24, embodiments where the shift signal generation unit 4 (9) is not included may be employed.

Figure 24:
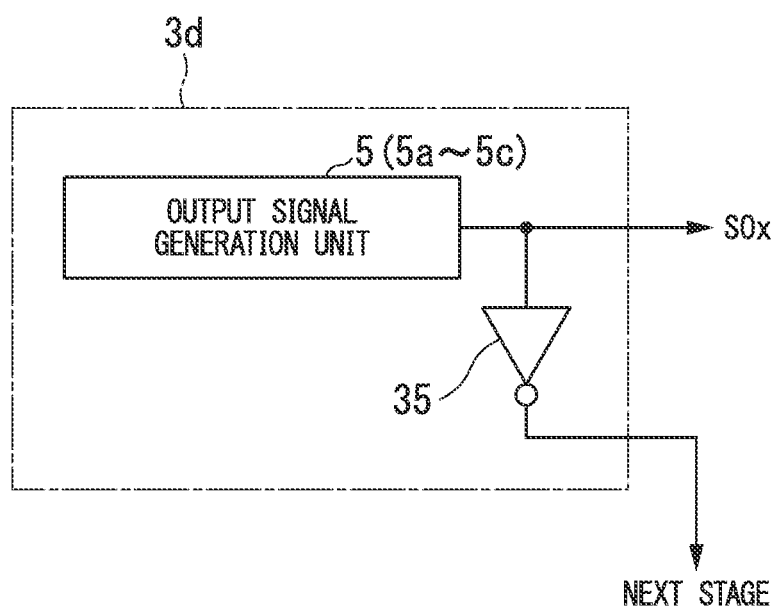
FIG. 24 is a block diagram showing a modified example of the SR unit circuit of the shift register circuit according to the present embodiment.

FIG. 24 is a block diagram showing a modified example of the SR unit circuit 3 (3a to 3c) of the shift register circuit 6 (6a to 6c).

In this figure, an SR unit circuit 3d includes the output signal generation unit 5 (5a to 5c) and an inverter circuit 35. The inverter circuit 35 outputs to the SR unit circuit 3d in the next stage, a logically inverted signal of the output signal SOx of the output signal generation unit 5 (5a to 5c). Thus, the SR unit circuit 3 (3a to 3c) may be configured not to include the shift signal generation unit 4 (9).

Additionally, the description has been given in the above embodiments with respect to, as an example, the case where the display device 100 is a liquid crystal display device. However, the display device 100 may be a display device of other types, such as an organic EL (Electro-Luminescence) display device, or an MEMS (Micro Electro Mechanical System) display device.

Further, the description has been given in the above embodiments with respect to the embodiments where the shift register circuit 6 (6a to 6c) is applied to the shift register included in the data signal driving circuit 106 of the display device 100. However, the shift register circuit 6 (6a to 6c) may be applied to the shift register circuit 109 of the scanning signal driving circuit 108.

Moreover, the description has been given in the above embodiments with respect to the pulse generation circuit 1 (1a to 1c) is applied to the shift register circuit 6 (6a to 6c). However, the present invention is not limited thereto. For example, the pulse generation circuit 1 (1a to 1c) may be applied to another portion included in the display device 100, which is different from the shift register. Alternatively, the pulse generation circuit 1 (1a to 1c) may be applied to another device other than the display device.

Additionally, the description has been given in the above embodiments with respect to, as an example, the case where the shift register circuit 6 (6a to 6c) performs the shift operation at both the timings of the rise and fall of two clock signals in different phases (SCK1, and SCK2), as shown in FIGS. 8 and 19. However, the present invention is not limited thereto. For example, the shift register circuit 6 (6a to 6c) may be applied to a shift register that performs shift operation at any one of the timings of the rise and fall of the clock signals SCK1 and SCK2.

INDUSTRIAL APPLICABILITY

The present invention is applicable to display devices, such as a liquid crystal display device, an organic EL display device, and an MEMS display device.

DESCRIPTION OF REFERENCE NUMERALS 1, 1a, 1b, 1c: pulse generation circuit
2, 2a, 7, 7a: output control unit
3, 3_1 to 3_n, 3a, 3a_1 to 3a_n, 3b, 3b_1 to 3b_n, 3c, 3c_1 to 3c_n: SR unit circuit
4, 9: shift signal generation unit
5, 5a, 5b, 5c: output signal generation unit 6, 6a, 6b, 6c: shift register circuit
10, 60: output unit
11, 61: resistor
12, 21, 22, 31, 32, 33, 411, 421, 422: N-type transistor
13, 63, 423, 923: capacitor
20, 70: precharge unit
30, 30a, 80, 80a: reset unit
41, 91: shift output control unit
42, 92: shift output unit
62, 71, 72, 81, 82, 83, 911, 921, 922: P-type transistor
100: display device
101: timing signal generation circuit
102: display panel
103: control circuit
104: power supply circuit
105: display unit
106: data signal driving circuit
107: data processing circuit
108: scanning signal driving circuit
109: shift register circuit

The invention claimed is:

1. A pulse generation circuit comprising:
a plurality of transistors of a single conductivity;
a current limiting element that supplies, by a predetermined current, a first voltage from a first power supply line supplied with the first voltage to an output terminal, the current limiting element being connected between the first power supply line and the output terminal;
an output transistor that outputs an input signal to the output terminal in response to receiving a second voltage from a first control terminal of the output transistor;
a capacitive element connected between the output terminal and the first control terminal of the output transistor;
output circuitry that performs a bootstrap operation that outputs the first voltage to the output terminal in response to the input signal;
precharge circuitry that precharges the second voltage of the first control terminal of the output transistor to a third voltage at which the output transistor enters a conductive state, at least in a first period including a transition of an output of the output terminal from the first voltage to a predetermined voltage;
reset circuitry that, in a case that the output of the output terminal transitions from the predetermined voltage to the first voltage, resets the second voltage of the first control terminal of the output transistor to a fourth voltage at which the output transistor enters a non-conductive state; and
output control circuitry that:
controls the second voltage of the first control terminal of the output transistor so that the output transistor is in the conductive state at least in a second period from a first time the output of the output terminal transitions from the first voltage to the predetermined voltage to a second time the output of the output terminal transitions again to the first voltage;
initiates, based on the third voltage precharged by the precharge circuitry, the bootstrap operation in a case that the output terminal transitions to the first voltage, and after the output terminal transitions to the first voltage, terminates the bootstrap operation; and
performs, based on the fourth voltage reset by the reset circuitry, control so as to output the first voltage from the current limiting element to the output terminal.

2. The pulse generation circuit according to claim 1, wherein the reset circuitry comprises:
a reset transistor connected between the first control terminal of the output transistor and a second power supply line supplied with a fifth voltage, the reset transistor including a second control terminal connected to the output terminal.

3. The pulse generation circuit according to claim 1, wherein the reset circuitry comprises:
a first reset transistor and a second reset transistor connected in series between the first control terminal of the output transistor and a second power supply line supplied with a fifth voltage, wherein
the first reset transistor includes a second control terminal connected to the output terminal, and
the second reset transistor includes a third control terminal connected to a signal line in a phase different from that of the input signal.

4. The pulse generation circuit according to claim 1, wherein
the plurality of transistors of the single conductivity includes a plurality of N-channel transistors, and
the first voltage is higher than the second voltage.

5. The pulse generation circuit according to claim 1, wherein
the plurality of transistors of the single conductivity includes a plurality of P-channel transistors, and
the first voltage is higher than a fifth voltage supplied by a second power supply line.

6. A shift register circuit comprises:
a plurality of circuits connected in multiple stages,
wherein the plurality of circuits include a pulse generation circuit including a plurality of transistors of a single conductivity, and
the pulse generation circuit comprises:
a current limiting element that supplies, by a predetermined current, a first voltage from a first power supply line supplied with the first voltage to an output terminal, the current limiting element being connected between the first power supply line and the output terminal;
a first output transistor that outputs an input signal to the output terminal in response to receiving a second voltage from a first control terminal of the first output transistor;
a capacitive element connected between the output terminal and the first control terminal of the first output transistor;
output circuitry that performs a bootstrap operation that outputs the first voltage to the output terminal in response to the input signal;
precharge circuitry that precharges the second voltage of the first control terminal of the first output transistor to a third voltage at which the first output transistor enters a conductive state, at least in a first period including a transition of an output of the output terminal from the first voltage to a predetermined voltage;
reset circuitry that, in a case that the output of the output terminal transitions from the predetermined voltage to the first voltage, resets the second voltage of the first control terminal of the first output transistor to a fourth voltage at which the first output transistor enters a non-conductive state; and
output control circuitry that:
controls the second voltage of the first control terminal of the first output transistor so that the first output transistor is in the conductive state at least in a second period from a first time the output of the output terminal transitions from the first voltage to the predetermined voltage to a second time the output of the output terminal transitions again to the first voltage,
initiates, based on the third voltage precharged by the precharge circuitry, the bootstrap operation in a case that the output terminal transitions to the first voltage, and after the output terminal transitions to the first voltage, terminates the bootstrap operation, and
performs, based on the fourth voltage reset by the reset circuitry, control so as to output the first voltage from the current limiting element to the output terminal.

7. The shift register circuit according to claim 6, wherein the plurality of circuits comprise:
the pulse generation circuit in which a clock signal is input to the input signal;
output signal generation circuitry that outputs an output signal to the output terminal in response to the clock signal; and
shift signal generation circuitry that outputs a shift output signal in response to the output signal.

8. The shift register circuit according to claim 7, wherein the shift signal generation circuitry comprises:
a second output transistor configured to, in response to a fifth voltage of a control terminal, output, as the shift output signal, an inverted clock signal that is a clock signal in a phase opposite to that of the clock signal;
a third output transistor connected between a second power supply line supplied with a sixth voltage different from the first voltage and a signal line of the shift output signal, the third output transistor comprising a third control terminal connected to the output terminal;
a capacitance element connected between the signal line of the shift output signal and the second control terminal of the second output transistor; and
shift output control circuitry that controls a seventh voltage of the second control terminal of the second output transistor, so that the second output transistor is in the conductive state at least in a third period in which the shift output signal outputs the first voltage.

9. A display device comprising:
a driving circuit comprising a shift register circuit,
wherein the shift register circuit comprises a plurality of circuits connected in multiple stages,
the plurality of circuits comprise a pulse generation circuit including a plurality of transistors of a single conductivity, and
the pulse generation circuit comprises:
a current limiting element that supplies, by a predetermined current, a first voltage from a first power supply line supplied with the first voltage to an output terminal, the current limiting element being connected between the first power supply line and the output terminal;
an output transistor that outputs an input signal to the output terminal in response to receiving a second voltage from a first control terminal of the output transistor;
a capacitive element connected between the output terminal and the first control terminal of the output transistor;
output circuitry that performs a bootstrap operation that outputs the first voltage to the output terminal in response to the input signal;
precharge circuitry that precharges the second voltage of the first control terminal of the output transistor to a third voltage at which the output transistor enters a conductive state, at least in a first period including a transition of an output of the output terminal from the first voltage to a predetermined voltage;
reset circuitry that, in a case that the output of the output terminal transitions from the predetermined voltage to the first voltage, resets the second voltage of the first control terminal of the output transistor to a fourth voltage at which the output transistor enters a non-conductive state; and
output control circuitry that:
controls the second voltage of the first control terminal of the output transistor so that the output transistor is in the conductive state at least in a second period from a first time the output of the output terminal transitions from the first voltage to the predetermined voltage to a second time the output of the output terminal transitions again to the first voltage;
initiates, based on the third voltage precharged by the precharge circuitry, the bootstrap operation in a case that the output terminal transitions to the first voltage, and after the output terminal transitions to the first voltage, terminates the bootstrap operation; and
performs, based on the fourth voltage reset by the reset circuitry, control so as to output the first voltage from the current limiting element to the output terminal.

* * * * *